US011881719B2

(12) United States Patent
Stingu et al.

(10) Patent No.: US 11,881,719 B2
(45) Date of Patent: Jan. 23, 2024

(54) WIRELESS POWER TRANSFER OBJECT DETECTION CIRCUIT AND METHOD

(71) Applicant: Spark Connected LLC, Dallas, TX (US)

(72) Inventors: Petru Emanuel Stingu, Dallas, TX (US); Kenneth Moore, Dallas, TX (US); Yulong Hou, Farmers Branch, TX (US); Ruwanga Dassanayake, Dallas, TX (US)

(73) Assignee: Spark Connected LLC, Dallas, TX (US)

( * ) Notice: Subject to any disclaimer, the term of this patent is extended or adjusted under 35 U.S.C. 154(b) by 488 days.

(21) Appl. No.: 17/020,537

(22) Filed: Sep. 14, 2020

(65) Prior Publication Data

US 2021/0083525 A1  Mar. 18, 2021

Related U.S. Application Data

(60) Provisional application No. 62/899,607, filed on Sep. 12, 2019.

(51) Int. Cl.
*H02J 50/12* (2016.01)
*H02M 3/158* (2006.01)
(Continued)

(52) U.S. Cl.
CPC .............. *H02J 50/12* (2016.02); *A47B 21/06* (2013.01); *G01R 33/0094* (2013.01);
(Continued)

(58) Field of Classification Search
CPC .......... H02J 50/12; H02J 50/005; H02J 50/10; H02J 50/60; H02J 50/80; H02J 50/402; A47B 21/06; A47B 2021/066; A47B 2200/008; G01R 33/0094; G01R 33/0206; G01R 33/07; G01R 33/10; G06F 1/189; G06F 1/1632; G06F 1/1656;
(Continued)

(56) References Cited

U.S. PATENT DOCUMENTS 3,376,578 A   4/1968   Sawyer
3,735,231 A   5/1973   Sawyer
(Continued)

OTHER PUBLICATIONS

Macmillan, "Definition of Associate" pp. 1 (Year: NA) (Year: NA).*
(Continued)

*Primary Examiner* — Daniel Kessie
*Assistant Examiner* — Brian K Baxter
(74) *Attorney, Agent, or Firm* — Slater Matsil, LLP

(57) ABSTRACT

In an embodiment, a method includes: wirelessly transmitting power using a transmitter LC tank; wirelessly receiving power from the transmitter LC tank using a receiver LC tank; interrupting wirelessly transmitting power for a slot period; during the slot period, shorting the receiver LC tank; during the slot period and after shorting the receiver LC tank, measuring a transmitter signal associated with the transmitter LC tank; determining a power loss associated with the wirelessly transmitting power based on the measured transmitter signal; and detecting a metallic object based on the determined power loss.

46 Claims, 12 Drawing Sheets

(51) Int. Cl.
| | |
|---|---|
| *H02J 50/80* | (2016.01) |
| *H02J 50/10* | (2016.01) |
| *H02J 50/00* | (2016.01) |
| *A47B 21/06* | (2006.01) |
| *G06F 1/18* | (2006.01) |
| *H02J 50/60* | (2016.01) |
| *G01R 33/00* | (2006.01) |
| *G01R 33/02* | (2006.01) |
| *G01R 33/07* | (2006.01) |
| *G01R 33/10* | (2006.01) |

(52) U.S. Cl.
CPC ......... *G01R 33/0206* (2013.01); *G01R 33/07* (2013.01); *G01R 33/10* (2013.01); *G06F 1/189* (2013.01); *H02J 50/005* (2020.01); *H02J 50/10* (2016.02); *H02J 50/60* (2016.02); *H02J 50/80* (2016.02); *H02M 3/1582* (2013.01); *A47B 2021/066* (2013.01); *A47B 2200/008* (2013.01)

(58) Field of Classification Search
CPC ...... G06F 1/1698; G06F 1/263; G06F 1/1635; H02M 3/1582; H02M 3/285; H02M 3/33584
See application file for complete search history.

(56) References Cited

U.S. PATENT DOCUMENTS

| | | | |
|---|---|---|---|
| 4,860,183 | A | 8/1989 | Maeda et al. |
| 5,434,504 | A | 7/1995 | Hollis et al. |
| 5,498,948 | A | 3/1996 | Bruni et al. |
| 6,175,169 | B1 | 1/2001 | Hollis, Jr. et al. |
| 6,184,651 | B1 | 2/2001 | Fernandez et al. |
| 6,445,093 | B1 | 9/2002 | Binnard |
| 6,803,744 | B1 | 10/2004 | Sabo |
| 6,949,845 | B2 | 9/2005 | Oisugi et al. |
| 8,049,370 | B2 | 11/2011 | Azancot et al. |
| 8,193,769 | B2 | 6/2012 | Azancot et al. |
| 8,957,549 | B2 | 2/2015 | Kesler et al. |
| 9,590,444 | B2 | 3/2017 | Walley et al. |
| 9,800,191 | B2 | 10/2017 | Barsilai et al. |
| 9,853,441 | B2 | 12/2017 | Teggatz et al. |
| 10,054,622 | B2 | 8/2018 | Hernandez et al. |
| 10,079,090 | B2 | 9/2018 | Teggatz et al. |
| 10,168,443 | B2 | 1/2019 | Mangano et al. |
| 2006/0061323 | A1 | 3/2006 | Cheng et al. |
| 2010/0171369 | A1 | 7/2010 | Baarman et al. |
| 2010/0181841 | A1 | 7/2010 | Azancot et al. |
| 2010/0219183 | A1 | 9/2010 | Azancot et al. |
| 2010/0244579 | A1 | 9/2010 | Sogabe et al. |
| 2011/0050164 | A1 | 3/2011 | Partovi et al. |
| 2011/0062793 | A1 | 3/2011 | Azancot et al. |
| 2011/0074344 | A1 | 3/2011 | Park et al. |
| 2011/0121660 | A1 | 5/2011 | Azancot et al. |
| 2011/0227527 | A1 | 9/2011 | Zhu et al. |
| 2012/0032632 | A1 | 2/2012 | Soar |
| 2013/0049484 | A1 | 2/2013 | Weissentern et al. |
| 2013/0082651 | A1 | 4/2013 | Park et al. |
| 2013/0257165 | A1* | 10/2013 | Singh ............. G01V 3/12 307/104 |
| 2013/0257172 | A1 | 10/2013 | Teggatz et al. |
| 2013/0264973 | A1 | 10/2013 | Garg et al. |
| 2013/0285601 | A1 | 10/2013 | Sookprasong et al. |
| 2013/0300204 | A1 | 11/2013 | Partovi |
| 2014/0080409 | A1 | 3/2014 | Frankland et al. |
| 2014/0084857 | A1* | 3/2014 | Liu ............. H02J 50/402 320/108 |
| 2014/0111154 | A1* | 4/2014 | Roy ............. H01F 38/14 320/108 |
| 2014/0184150 | A1 | 7/2014 | Walley |
| 2015/0115877 | A1 | 4/2015 | Arai et al. |
| 2015/0142348 | A1 | 5/2015 | Huang et al. |
| 2015/0249484 | A1 | 9/2015 | Mach et al. |
| 2015/0341087 | A1 | 11/2015 | Moore et al. |
| 2016/0149440 | A1* | 5/2016 | Staring ............. H02J 50/40 307/104 |
| 2016/0181818 | A1* | 6/2016 | Joye ............. H04B 5/0031 307/104 |
| 2016/0309418 | A1* | 10/2016 | Sedzin ............. H04B 5/0087 |
| 2017/0163100 | A1 | 6/2017 | Vocke et al. |
| 2017/0222485 | A1* | 8/2017 | Covic ............. H01F 41/04 |
| 2017/0288412 | A1* | 10/2017 | Yamamoto ............ H02J 50/402 |
| 2018/0197678 | A1* | 7/2018 | Uchida ............. H02J 50/60 |
| 2018/0301942 | A1 | 10/2018 | Brohlin et al. |
| 2019/0068001 | A1* | 2/2019 | Lovas ............. H02J 50/10 |
| 2019/0084433 | A1* | 3/2019 | Wang ............. B60L 9/00 |
| 2019/0109498 | A1* | 4/2019 | Stingu ............. H03F 3/217 |
| 2019/0190320 | A1 | 6/2019 | Park |
| 2019/0214842 | A1 | 7/2019 | Wheeland et al. |
| 2019/0312466 | A1* | 10/2019 | Mynar ............. H02J 50/12 |
| 2019/0319494 | A1 | 10/2019 | Park et al. |
| 2019/0334388 | A1* | 10/2019 | Van Wageningen .... H02J 50/12 |
| 2020/0169124 | A1* | 5/2020 | Mehas ............. H02J 50/12 |
| 2020/0395793 | A1* | 12/2020 | Ettes ............. H02J 50/60 |
| 2022/0224166 | A1* | 7/2022 | Sato ............. H02J 50/60 |

OTHER PUBLICATIONS

Consumer Reports, "Wireless charging pad review We tested four popular pads to see whether they really make your life easier", Wireless Charging Pad Reviews, Dec. 11, 2013, 5 pages.

Digi-Key Electronics, "Inductive Versus Resonant Wireless Charging: A Truce May Be a Designer's Best Choice", Aug. 2, 2016, 8 pages.

Gao, Xiang, "Demodulating Communication Signals of Qi-Compliant Low-Power Wireless Charger Using MC56F8006 DSC", NXP Freescale Semiconductor Application Note, Document No. AN4701, Rev. 0, Mar. 2013, 21 pages.

Jansen, J. W., et al., "Overview of analytical models for the design of linear and planar motors", TU/e Eindhoven University of Technology, DOI: 10.1109/TMAG/2014.2328556, Jan. 1, 2014, 8 pages.

Johns, Bill et al., "Adapting Qi-compliant wireless-power solutions to low-power wearable products", Texas Instruments, High-Performance Analog Products, 2Q, 2014, Analog Applications Journal, 7 pages.

Kot, Thomas, "LC Sensor Rotation Detection with MSP430 Extended Scan Interface (ESI)", Texas Instruments, Application Report, SLAA639, Jul. 2014, 33 pages.

Lynch, Brian T., "Under the Hood of a DC/DC Boost Converter", Texas Instruments, Texas Instruments, Power Supply Design Seminar, Paper SEM1800, Dallas, TX, USA, 2008-2009, 26 pages.

Rice, John, "Examining Wireless Power Transfer", Texas Instruments, 2014/2015 Power Supply Design Seminar, 38 pages.

Texas Instruments "Industry-Leading Wireless Power Solutions—The Most Widely Adopted in the Market", ti.com/wirelesspower, 3 pages.

Texas Instruments, "Introduction to Wireless Power", QI WPC 1.1 compliant, www.ti.com/wirelesspower, 49 pages.

Waters, Benjamin et al., "Optimal Coil Size Ratios for Wireless Power Transfer Applications", IEEE International Symposium on Circuits and Systems (ISCAS), Jun. 1-5, 2014, 4 pages.

Wikipedia, "Electromagnetic coil", https://en.wikipedia.org/w/index.php?title=Electromagnetic_coil&oldid=776415501, Apr. 2017, 6 pages.

Wikipedia, "Inductive charging", https://en.wikipedia.org/w/index.php?title=Inductive_charging&oldid=802615270, Sep. 2017, 7 pages.

Wikipedia, "Qi (standard)", https://en.wikipedia.org/w/index.php?title=Qi_(standard)&oldid=803427516, Oct. 2017, 5 pages.

ZENS, "ZENS First Worldwide to Introduce Built-in Wireless (Sub-)Surface Charger with Apple and Samsung Fast Charge", Jan. 24, 2019, 5 pages.

* cited by examiner

PRIOR ART

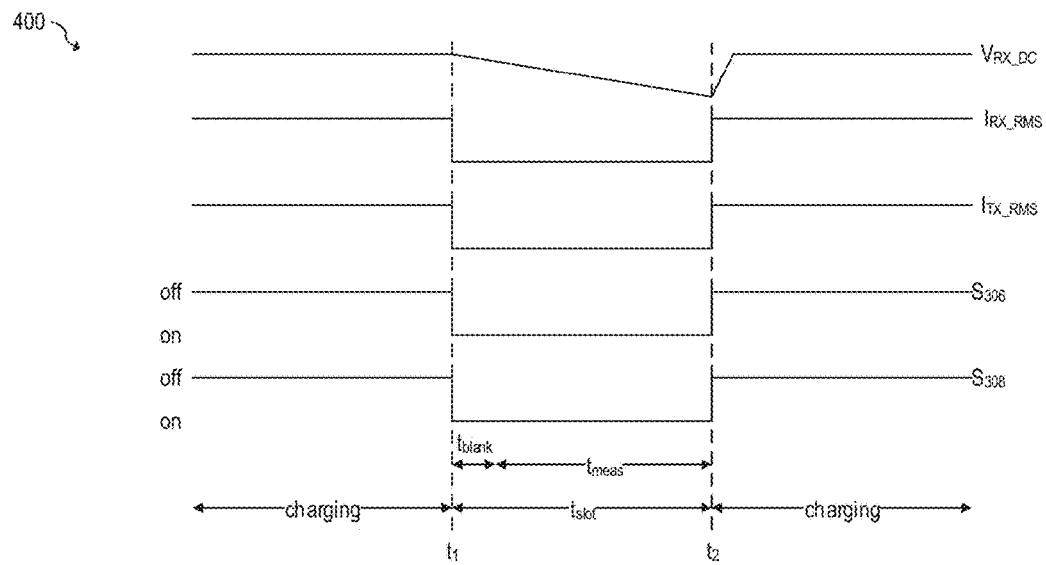
FIG. 4
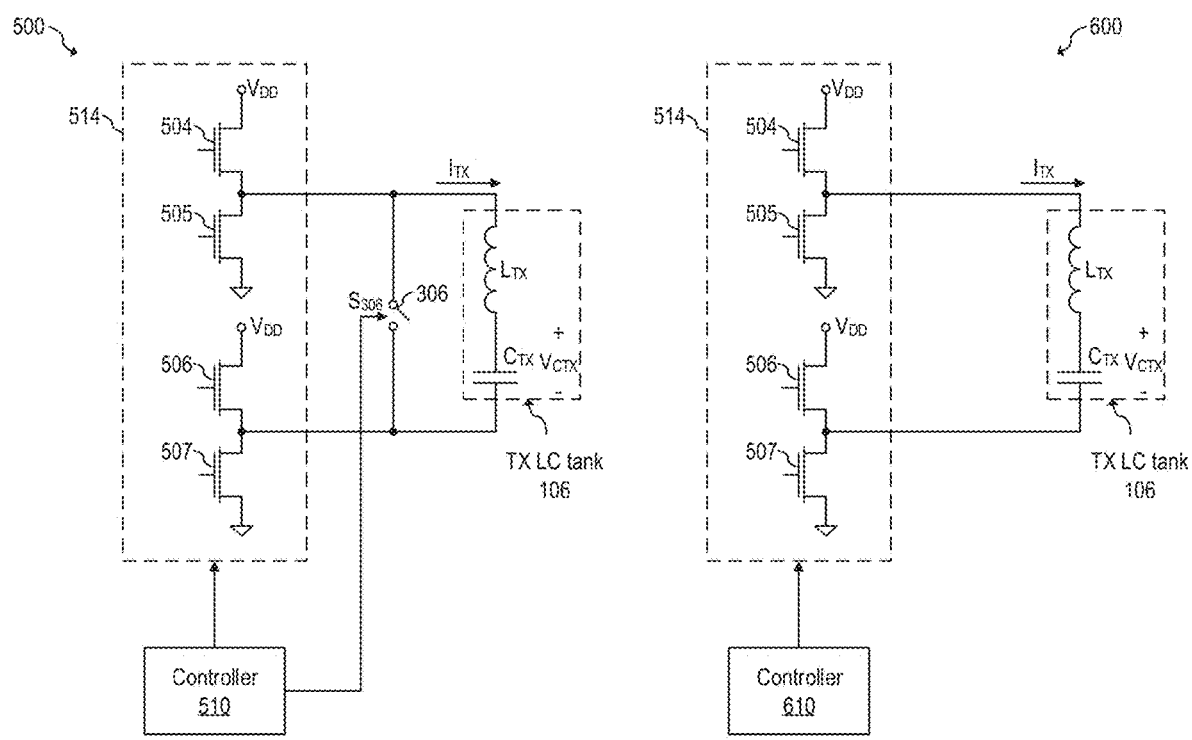
FIG. 5          FIG. 6

WIRELESS POWER TRANSFER OBJECT DETECTION CIRCUIT AND METHOD

CROSS-REFERENCE TO RELATED APPLICATIONS

This application claims the benefit of U.S. Provisional Application No. 62/899,607, entitled "Wireless Charging Circuit and Method," and filed on Sep. 12, 2019, which application is hereby incorporated herein by reference.

This application is filed concurrently with U.S. patent application Ser. No. 17/020,326, U.S. patent application Ser. No. 17/020,546, and U.S. patent application Ser. No. 17/020,494, each of which claim the benefit of U.S. Provisional Application No. 62/899,607, which applications are hereby incorporated herein by reference.

TECHNICAL FIELD

The present disclosure relates generally to an electronic system and method, and, in particular embodiments, to a wireless power transfer object detection circuit and method.

BACKGROUND

Wireless charging systems are becoming ubiquitous in today's society. For example, many smartphones and wearables implement wireless charging technology. Ease of use, greater reliability, spatial freedom, reduced connectors and openings, and the possibility of hermetically sealing are among the benefits offered by wireless charging. Wireless charging standards allow for interoperability between different devices and manufacturers. Some wireless charging standards, such as the Qi standard from the Wireless Power Consortium, and standards promoted by the AirFuel alliance, are becoming widely adopted. The Qi standard uses inductive charging operating between 80 kHz and 300 kHz to wirelessly transmit power from a transmitter to a receiver. Standards promoted by the AirFuel alliance use resonant wireless charging operating at 6.78 MHz to wirelessly transmit power from a transmitter to a receiver.

FIG. 1 shows exemplary wireless charging system 100. Wireless charging system 100 includes a transmitter (TX) device 102 that includes a transmitter coil $L_{TX}$, and a receiver (RX) device 104 that includes a receiver coil $L_{RX}$. The efficiency of the wireless power transmission generally depends on the coupling between the coil $L_{TX}$ and coil $L_{RX}$. The coupling between the coil $L_{TX}$ and coil is generally based on the relative position between the coil $L_{TX}$ and coil $L_{RX}$.

SUMMARY

In accordance with an embodiment, a method includes: wirelessly transmitting power using a transmitter LC tank; wirelessly receiving power from the transmitter LC tank using a receiver LC tank; interrupting wirelessly transmitting power for a slot period; during the slot period, shorting the receiver LC tank; during the slot period and after shorting the receiver LC tank, measuring a transmitter signal associated with the transmitter LC tank; determining a power loss associated with the wirelessly transmitting power based on the measured transmitter signal; and detecting a metallic object based on the determined power loss.

In accordance with an embodiment, a method includes: wirelessly transmitting power using a transmitter LC tank of a wireless power transmitter; wirelessly receiving power from the transmitter LC tank using a receiver LC tank of a wireless power receiver; interrupting wirelessly transmitting power for a slot period; during the slot period, measuring a receiver signal associated with the receiver LC tank; transmitting receiver data based on the measured receiver signal to the wireless power transmitter; determining a power loss associated with the wirelessly transmitting power based on the measured receiver signal; and detecting a metallic object based on the determined power loss.

In accordance with an embodiment, a method includes: wirelessly transmitting power using a transmitter LC tank; wirelessly receiving power from the transmitter LC tank using a receiver LC tank; interrupting wirelessly transmitting power for a first slot period; during the first slot period, measuring a transmitter signal associated with the transmitter LC tank; after interrupting wirelessly transmitting power for the first slot period, resuming wirelessly transmitting power using the transmitter LC tank; interrupting wirelessly transmitting power for a second slot period; during the second slot period, measuring a receiver signal associated with the receiver LC tank; after interrupting wirelessly transmitting power for the second slot period, resuming wirelessly transmitting power using the transmitter LC tank; determining a power loss associated with the wirelessly transmitting power based on the measured transmitter signal and the measured receiver signal; and detecting a metallic object based on the determined power loss.

In accordance with an embodiment, a method includes: measuring a magnetic bitmap using a sensing array of a wireless power transmitter; receiving a reference magnetic bitmap from a wireless power receiver; determining whether the measured magnetic bitmap and the reference magnetic bitmap match; and when the measured magnetic bitmap and the reference magnetic bitmap match, masking a presence of metals associated with the wireless power receiver in a wireless charging field associated with the wireless power transmitter during foreign object detection.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 shows waveforms of the wireless charging system of FIG. 3 during a micro-slot, according to an embodiment of the present invention;

FIGS. 5 and 6 show wireless power transmitters, according to embodiments of the present invention;

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
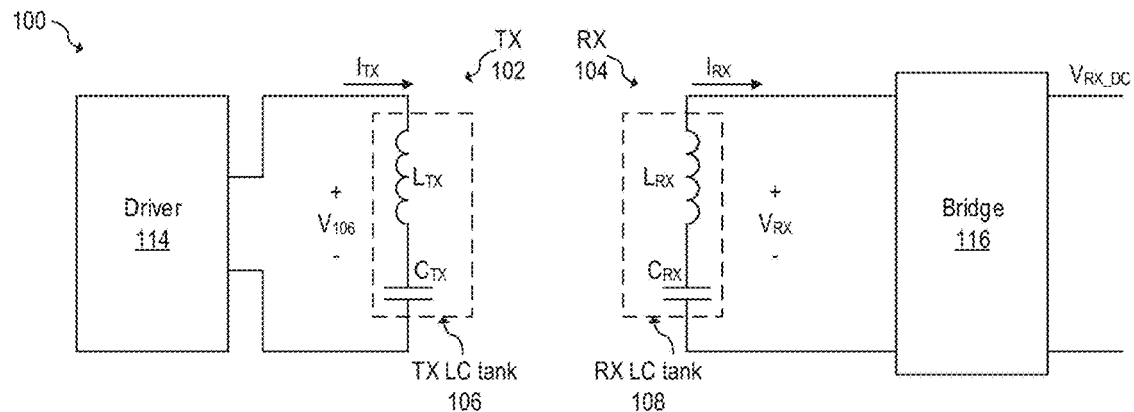
FIG. 1 shows an exemplary wireless charging system.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a foreign object detection (FOD) circuits and methods for wireless power transfer systems. Some embodiments may be implemented in other applications, such as applications that could benefit from metallic object detection, for example.

It is understood that the term wireless charging is not limited to the charging of a battery, but includes wireless power transmission generally, unless stated otherwise.

In an embodiment of the present invention, a wireless power transmitter performs foreign object detection (FOD) by measuring one or more characteristics of the transmitter LC tank during a micro-slot after shorting the receiver LC tank. The one or more characteristics of the transmitter LC tank are used to determine the power loss during wireless power transmission, which in turn is used to determine whether an object is present within the wireless charging field. In some embodiments, characteristics of the receiver LC tank are also used to determine the power loss.

In an embodiment of the present invention, friendly detected objects are distinguished from foreign detected objects by using a magnetic field reference map of the wireless power receiver. The reference map is generated by capturing the magnetic field map using a reference wireless power transmitter. The transmitter measures a magnetic field map using a sensing array when the wireless power receiver is near the wireless power transmitter and compares the measured map with the reference map. If the measured map and reference map match, the detected objects are categorized as friendly objects and wireless power transfer may proceed without being prevented by the presence of the friendly metallic objects.

During wireless power transmission, a wireless power transmitter (e.g., 102) transmits wireless power to a wireless power receiver (e.g., 104). The magnetic field produced by the wireless power transmitter (e.g., 102) may induce heat on metals exposed to such magnetic field. In addition to reduced efficiency, the presence of foreign objects may produce a safety hazard, such as by causing the generation of excessive field in a nearby metallic object. Thus, it is often desirable to detect foreign objects, such as metallic foreign objects before and/or during wireless power transmission.

When a metal is detected near the transmitter of an inductive wireless charging system, the transmitter may be turned off, or the amount of power that is delivered by the transmitter may be reduced, e.g., to avoid safety hazards caused by heating the detected metal.

A method for performing foreign object detection (FOD) during wireless power transmission may be based on the amount of power loss during wireless power transmission. For example, a foreign object, such as a metallic object, may be detected by the wireless power transmitter (e.g., 102) when the amount of power transmitted by the wireless power transmitter (e.g., 102) minus the amount of power received by the wireless power receiver (e.g., 104) is higher than a predetermined threshold.

The amount of power transmitted may be estimated based on current $I_{TX}$ and the voltage across coil $L_{TX}$. Similarly, the amount of power received may be estimated based on current $I_{RX}$ and the voltage across coil $L_{RX}$.

Some characteristics associated with the transmitter LC tank 106, such as the inductance of coil $L_{TX}$, damping coefficient and quality factor, may be affected by the presence of nearby objects, such as metallic objects located within the wireless charging field (the area or space where the magnetic field generated by coil $L_{TX}$ reaches) produced by the transmitter coil $L_{TX}$. Similarly, some characteristics associated with the receiver LC tank 108, such as the inductance of coil $L_{RX}$, damping coefficient and quality factor, may be affected by the presence of nearby objects, such as metallic objects located within the wireless charging field produced by the transmitter coil $L_{TX}$. For example, since the receiver coil $L_{RX}$ is magnetically coupled to the transmitter coil $L_{TX}$ when near the transmitter coil $L_{TX}$, the presence of nearby metallic foreign object may cause changes in characteristics of both the transmitter LC tank 106 and the receiver LC tank 108.

In an embodiment of the present invention, the power loss is estimated based on characteristics of the transmitter LC tank and/or the receiver LC tank. In some embodiments, estimating power loss based on the characteristics of the transmitter LC tank and/or the receiver LC tank advantageously allows for achieving greater precision and allowing for determining the power loss by performing low-voltage measurements, even when the power that is wirelessly transferred is relatively high (such as 30 W, 45 W, 55 W, 200 W, or higher).

Figure 2:
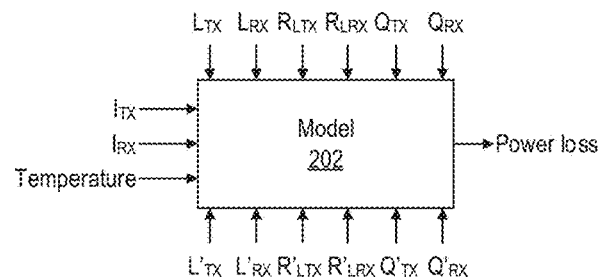
FIG. 2 shows a model for estimating power loss during wireless power transfer, according to an embodiment of the present invention.

FIG. 2 shows model 202 for estimating power loss during wireless power transfer, according to an embodiment of the present invention. As shown in FIG. 2, model 202 receives as inputs nominal values of the transmitter inductance $L_{TX}$, resistance $R_{LTX}$, quality factor $Q_{TX}$, and receiver inductance $L_{RX}$, resistance $R_{LRX}$, and quality factor $Q_{RX}$, as well as measured/determined/estimated values for currents $I_{TX}$, $I_{RX}$, temperature of the transmitter and/or receiver coil, transmitter inductance $L'_{TX}$, resistance $R'_{LTX}$, quality factor $Q'_{TX}$, and receiver inductance $L'_{RX}$, resistance $R'_{LRX}$, and quality factor $Q'_{RX}$.

Model 202 may estimate the power loss during wireless power transfer based on one or more of the received inputs. For example, the presence of a metallic object within the charging field may cause an increase in the resistance R associated with the transmitter inductance $L_{TX}$. In some embodiments, the increase in resistance R associated with the transmitter inductance $L_{TX}$ is related to the power loss during wireless power transfer. In some embodiments, the power loss is estimated based on $I_{TX}^2 \cdot (R'_{LTX} - R_{LTX})$.

In some embodiments, the presence of a metallic object within the charging field may cause an increase in the resistance R associated with the receiver inductance $L_{RX}$. In some embodiments, the power loss is estimated based on $I_{RX}^2 \cdot (R'_{LRX} - R_{LRX})$. In some embodiments, the power loss is estimated based on $I_{LTX}^2 \cdot (R'_{LTX} - R_{LTX}) + I_{RX}^2 \cdot (R'_{LRX} - R_{LRX})$.

In some embodiments, a change in the inductance of the transmitter coil $L_{TX}$ and/or of the receiver coil $L_{RX}$ caused by the presence of a nearby foreign object causes a change in the power loss. In some embodiments, the power loss is estimated based on $(L'_{TX} - L_{TX})$ and/or $(L'_{RX} - L_{RX})$.

In some embodiments, a change in the quality factor associated with the TX LC tank 106 and/or RX LC tank 108 caused by the presence of a nearby foreign object causes a change in the power loss. In some embodiments, the power loss is estimated based on $(Q'_{TX} - Q_{TX})$ and/or $(Q'_{RX} - Q_{RX})$.

In some embodiments, variations in temperature of the receiver coil $L_{TX}$ and/or receiver coil $L_{RX}$ cause changes in the power loss. In some embodiments, the power loss is estimated based on the temperature of the transmitter coil $L_{TX}$ and/or the temperature of the receiver coil $L_{RX}$, e.g., to compensate for temperature-related changes in resistance and inductance of the coils.

In some embodiments, once the power loss is estimated (e.g., based on model 202), the presence of a foreign object may be detected by comparing the power loss with a predetermined threshold (e.g., if the power loss is higher than the predetermined threshold, a foreign object is detected). Thus, in some embodiments, FOD is based on measurements of characteristics associated with the TX LC tank 106 and/or RX LC tank 108, such as inductance, and damping coefficient and quality factor associated with the LC tank (e.g., 106 and/or 108).

The inductance, and capacitance of the LC tank, and the resistance associated with the coil, as well as the associated quality factor and damping coefficient may be measured or determined in various ways. For example, the damping coefficient of an LC tank (e.g., 106 or 108) may be determined based on the (e.g., nominal) capacitance C of the LC tank, the inductance L of the LC tank, and on the resistance R associated with the inductance of the LC tank. For example, the damping coefficient $\zeta$ may be given by $$\zeta = \frac{R}{2} \cdot \sqrt{\frac{C}{L}} \tag{1}$$

The quality factor of an LC tank (e.g., 106 or 108) may be determined based on the capacitance of the LC tank, the inductance of the LC tank, and on the resistance associated with the inductance of the LC tank. For example, the quality factor Q may be given by $$Q = \frac{1}{R} \cdot \sqrt{\frac{L}{C}} \tag{2}$$

The quality factor may also be given by $$Q = \frac{2\pi f_o L}{R} \tag{3}$$

where $f_o$ is the resonance frequency of the LC tank.

The quality factor and damping coefficient associated with an LC tank may be related as $$\zeta = \frac{1}{2Q} \tag{4}$$

The damping coefficient $\zeta$ may also be given by $$\zeta = \frac{1}{\tau 2\pi f_o} \tag{5}$$

where $\tau$ is the time constant of the LC tank.

The resonance frequency $f_o$ may be given by $$f_o = \frac{1}{2\pi \sqrt{LC}} \tag{6}$$

In some embodiments, the damping coefficient may be estimated by determining the amount of reduction in peak values of oscillations of the LC tank when the LC tank is shorted (e.g., by the amount of voltage reduction between a first peak and a second peak). In some embodiments, the first set of peaks after shorting the LC tank (e.g., the first peak, or the first two peaks) are ignored to avoid corrupting the measurement as a result of artifacts that may be caused the shorting of the LC tank. For example, in some embodiments, the third and fourth peaks are used for determining the damping coefficient.

In some embodiments, the peaks used for determining the damping coefficient are not consecutive. For example, in some embodiments, the third and eight peaks are used for determining the damping coefficient. Other peaks may be used. In some embodiments, using peaks that span more than two consecutive cycles of the oscillation may advantageously result a more accurate estimation of the damping coefficient.

In some embodiments, the resonance frequency may be determined by measuring the time between two subsequent zero-crossings of the oscillations of the LC tank when the LC tank is shorted.

In some embodiments, the current flowing through the LC tank (e.g., $I_{TX}$ or $I_{RX}$) may be sampled, e.g., with a sampling frequency that is higher than the switching frequency of the wireless power transmitter (e.g., 10 MHz sampling frequency for a 100 kHz wireless power transfer frequency), and parameters, such as damping coefficient and resonant frequency may be estimated from such data. The sampling of the current (e.g., $I_{TX}$ or $I_{RX}$) may be performed by an analog-to-digital converter (ADC) for measuring a voltage across a sense resistor through which the current (e.g., $I_{TX}$ or $I_{RX}$), or a replica or scaled replica of such a current, flows. In some embodiments, other signals, such as voltage $V_{CTX}$ or $V_{CRX}$, may also be sampled and used in a similar manner, instead of, or in addition to currents $I_{TX}$ or $I_{RX}$.

The inductance value L of the LC tank (e.g., 106 or 108), and the associated resistance value R may be estimated, e.g., using one or more of Equations 1-6. In some embodiments, the value of capacitance C of the LC tank is assumed to not change.

The values of one or more of R, L, C, Q, and $\zeta$ may be determined in other ways, such as by using Equations 1-6 and/or measuring one or more of the R, L, C, Q, and $\zeta$ parameters in different ways.

Model 202 may operate with fewer inputs. For example, in some embodiments, temperature may be omitted. In some embodiments, measurements for currents $I_{TX}$ and/or $I_{RX}$ may be omitted, other parameters or combination of parameters may be omitted.

It is understood that although model 202 is shown to receive as inputs inductances, resistances, and quality factor values, other related parameters may also be used. For example, in some embodiments, model 202 may receive nominal and measured resonance frequencies, nominal and measured voltage differences between first and second oscillation peaks, and nominal transmitter and receiver capacitances, instead of $L_{TX}$, $L_{RX}$, $R_{LTX}$, $R_{LRX}$, $Q_{TX}$, $Q_{RX}$, $L'_{TX}$, $L'_{RX}$, $R'_{LTX}$, $R'_{LRX}$, $Q'_{TX}$, and $Q'_{RX}$ to estimate the power loss.

In some embodiments, the nominal values of the inputs of model 202 (e.g., $L_{TX}$, $L_{RX}$, $R_{TX}$, $R_{RX}$, $Q_{TX}$, and $Q_{RX}$) are determined during characterization.

The values for currents $I_{TX}$ and $I_{RX}$ may be determined/measured/estimated during wireless power transfer. For example, in some embodiments, a sense resistor in series with the LC tank may be used to determine the current flowing through it. In some embodiments, the current flowing through the LC tank is determined in other ways. For example, in some embodiments, a half-bridge is used to drive the transmitter LC tank. The voltage across the current path terminals of the high-side or low-side transistors when current $I_{TX}$ is flowing through it may be used to determine current $I_{TX}$. Other methods for estimating currents $I_{RX}$ and $I_{TX}$, such as based on voltages $V_{CRX}$ and $V_{CTX}$, may also be implemented.

Figure 3:
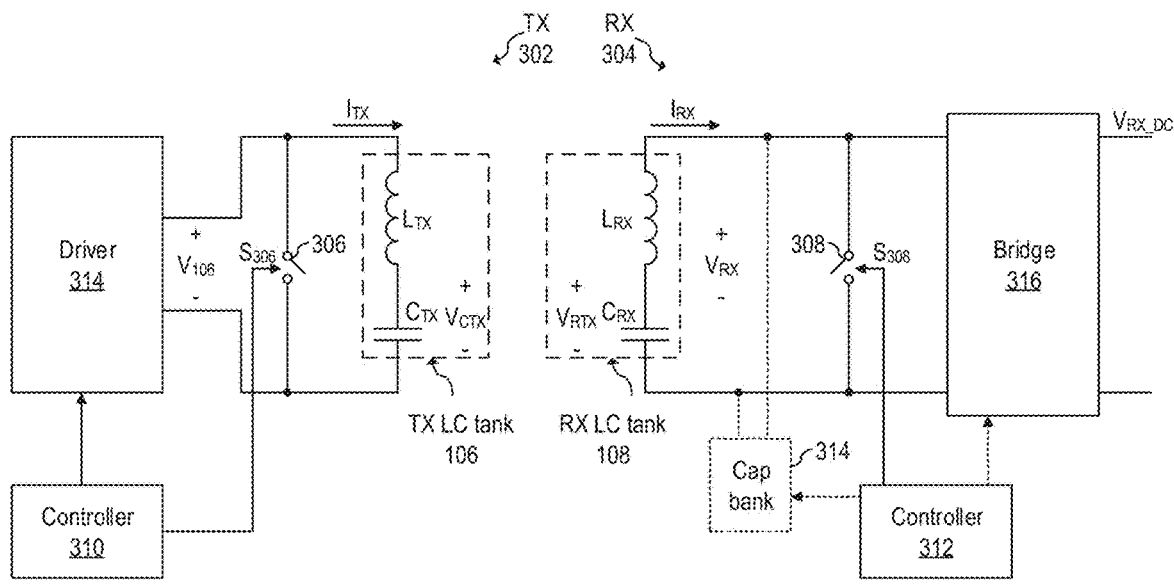
FIG. 3 shows a wireless charging system, according to an embodiment of the present invention.

In some embodiments, the measurement of characteristics of the TX LC tank 106 and RX LC tank 108 are performed during a period of time (e.g., 100 μs to 200 μs) in which the wireless power transmitter stops charging, and in which the TX LC tank 106 and the RX LC tank 108 are shorted. For example, FIG. 3 shows wireless charging system 300, according to an embodiment of the present invention.

During wireless power transfer, switch 306 is open and driver 314 drives LC tank 106 with signals switched to generate a current $I_{TX}$, e.g., having a frequency between 100 kHz and 200 kHz. The magnetic field generated by transmitter coil $L_{TX}$ as a result of the flow of current $I_{TX}$ induces current $I_{RX}$ to flow through LC tank 108. Switch 308 is open during wireless power transfer, and bridge 316 produces a rectified voltage $V_{RX\_DC}$ based on the voltage across LC tank 108.

In some embodiments, to measure one or more characteristics of the LC tank 106 and/or LC tank 108, wireless power transfer is temporarily interrupted for a period of time (e.g., 200 μs) and switches 306 and/or 308 are closed to allow the respective LC tank (106 and/or 108) to resonate so that one or more parameters of the LC tank are measured. The period of time in which wireless power transfer is temporarily interrupted, e.g., for performing measurements may be referred to as a micro-slot.

FIG. 4 shows waveforms 400 of wireless charging system 300 during a micro-slot, according to an embodiment of the present invention. Although for simplicity, $I_{RX}$ and $I_{TX}$ are shown in FIG. 4 with RMS values dropping immediately to zero upon the beginning of the micro-slot, $I_{RX}$ and $I_{TX}$ generally do not drop immediately to zero but show a damped oscillating waveform. In some embodiments, when power is on (charging) currents $I_{RX}$ and $I_{TX}$ show steady state oscillations (e.g., no DC values).

As shown in FIG. 4, the micro-slot has a duration of $t_{slot}$. In some embodiments, $t_{slot}$ is, e.g., between 100 μs to 200 μs. In some embodiments, the duration of $t_{slot}$ is lower than 100 μs or higher than 200 μs.

The currents $I_{TX}$ and $I_{RX}$ may be measured or determined during charging (e.g., before time $t_1$ or after time $t_2$) with reasonable accuracy by methods known in the art.

At time $t_1$, switches 306 and 308 are closed, which causes LC tanks 106 and 108 to short and freely oscillate at its (e.g., respective) resonant frequency with a decaying (e.g., exponential) envelope. After a blanking time $t_{blank}$, characteristics of LC tank 106 and/or 108 may be measured. At time $t_2$, switches 306 and 308 are opened so that wireless power continues to flow from wireless power transmitter 302 into wireless power receiver 304.

In some embodiments, the resonant frequency $f_o$ of the TX LC tank 106 (and/or 108) may be measured during time $t_{meas}$ by detecting one or more zero-crossings of the current $I_{TX}$ and/or voltage $V_{CTX}$ (and/or current $I_{RX}$ and/or voltage $V_{CRX}$) and measuring the time between the one or more zero-crossings (e.g., since the time between 2 consecutive zero-crossings is equal to $\frac{1}{2}f_o$).

In some embodiments, the damping coefficient $\zeta$ of the TX LC tank 106 (and/or 108) may be measured during time $t_{meas}$ by measuring peaks of oscillations of the current $I_{TX}$ and/or voltage $V_{CTX}$ (and/or current $I_{RX}$ and/or voltage $V_{CRX}$) and determining the amount of decrease (e.g., to determine the envelope associated with the decay in oscillations).

In some embodiments, other parameters of LC tank 106 and/or 108 may be determined directly indirectly based on measurements performed during $t_{meas}$.

Blanking time $t_{blank}$ may be used to prevent performing measurement during the first portion of the free oscillations of the LC tank. By avoiding measuring characteristics of the LC tank during the blanking time $t_{blank}$, some embodiments advantageously avoid performing measurements that may be corrupted by artifact caused by, e.g., in-rush current caused by the closing of switches 306 and/or 308 or other artifacts.

In some embodiments, blanking time $t_{blank}$ may be, e.g., lower than 50 μs, such as 20 μs (which may correspond to 2 oscillation cycles of the LC tank). A different blanking time, such as larger than 20 µs, such as 25 µs or larger (and/or covering more than 2 oscillation cycles of the LC tank), or shorted, such as 15 µs or shorter (and/or covering less than 2 oscillation cycles of the LC tank) may be used.

In some embodiments, the shorting of switches 306 and 308 respectively decouple the associated LC tank (106 or 108) from the rest of the circuit.

In some embodiments, only parameters of the TX LC tank 106 are measured and used in model 202 (e.g., no parameters from RX LC tank 108 are measured or used).

In some embodiments, closing switch 308 advantageously allows for a reduction in the blanking time and, therefore, may be advantageous to perform even when no measurement of the LC tank 108 is to be performed. In some embodiments, reducing the blanking time may allow for a reduction in the micro-slot time.

In some embodiments, only parameters of the RX LC tank 108 are measured and used in model 202 (e.g., no parameters from TX RC tank 106 are measured or used).

In some embodiments, the micro-slot may occur periodically, such as every 1 second, every 2 seconds, or slower. In other embodiments, the micro-slot may occur faster than once a second. In some embodiments, the micro-slot occurs, instead of, or in addition to periodically, when a change in temperature (e.g., of the coil $L_{TX}$ and/or $L_{RX}$), a change in operating frequency of driver 314, a change in switching mode, and/or during a calibration process.

In some embodiments, the calibration process is performed, e.g., when no metallic objects are at a charging distance from the wireless charging field. During the calibration process, measurements of one or more parameters received as input for model 202 (e.g., $L'_{TX}$, $R'_{LTX}$, and/or $Q'_{TX}$) are measured, and the nominal values may be updated, or the gain and/or offset applied to the input values before further processing inside model 202 is adjusted so that the measured value during the calibration process matches the nominal value. By performing the calibration process, some embodiments advantageously compensate for shifts caused, e.g., by aging, temperature variations, and other (e.g., slow) environmental changes.

Capacitor bank 314 may be implemented, e.g., by using a plurality of capacitors in series with respective transistors. Controller 312 is configured to connect and disconnect one or more of the plurality of capacitors (e.g., for purposes of in-band communication) to cause fluctuations in the current $I_{RX}$, which can be sensed by controller 310, e.g., by measuring (or causing to be measured) the voltage $V_{CTX}$.

Controller 312 may be implemented, e.g., as a general purpose or custom microcontroller including combinatorial logic coupled to a memory. Other implementations are also possible.

Controller 312 may be perform, either directly or via another circuit (such as amplifier, ADC, analog or digital filter(s), etc.) one or more (or all) measurements of characteristics of LC tank 108.

Controller 310 may be implemented, e.g., as a general purpose or custom microcontroller including combinatorial logic coupled to a memory. Other implementations are also possible.

Controller 310 may be perform, either directly or via another circuit (such as amplifier, ADC, analog or digital filter(s), etc.) one or more (or all) measurements of characteristics of LC tank 106.

In some embodiments, model 202 may be implemented, e.g., by controller 310.

In some embodiments, the wireless power receiver 304 transmits to wireless power transmitter 302 the measured information (e.g., data associated with one or more of $L'_{RX}$, $R'_{LRX}$, and/or $Q'_{RX}$) via in-band communication (e.g., by performing load modulation using capacitor bank 314) and/or out-of-band communication (e.g., using Bluetooth, WiFi, or other wireless communication protocol), e.g., for use by controller 310 to apply model 202.

In some embodiments, driver 314 may be implemented with first and second half-bridges respectively driving opposite terminals of LC tank 106. Other implementations are also possible.

In some embodiments, bridge 316 may be implemented with a diode bridge rectifier. In some embodiments, bridge 316 may be implemented with a synchronous rectifier. Other implementations are also possible.

FIG. 5 shows wireless power transmitter 500, according to an embodiment of the present invention. Wireless power transmitter 302 may be implemented as wireless power transmitter 500.

Wireless power transmitter 500 operates in a similar manner as wireless power transmitter 302, and implements driver 314 as driver 514. In some embodiments, switch 306 may be omitted, and the shorting of LC tank 106 may be achieved, e.g., by turning on transistors 505 and 507 and turning off transistors 504 and 506 (or turning on transistors 504 and 506 and turning off transistors 505 and 507) during the micro-slot. For example, FIG. 6 shows wireless power transmitter 600, according to an embodiment of the present invention. Wireless power transmitter 302 may be implemented as wireless power transmitter 600.

Wireless power transmitter 600 operates in a similar manner as wireless power transmitter 500. Wireless power transmitter 600, however, does not include switch 306, and instead controls transistors 504, 505, 506, and 607, using controller 610, to short LC tank 106 during a micro-slot.

Figure 7A:
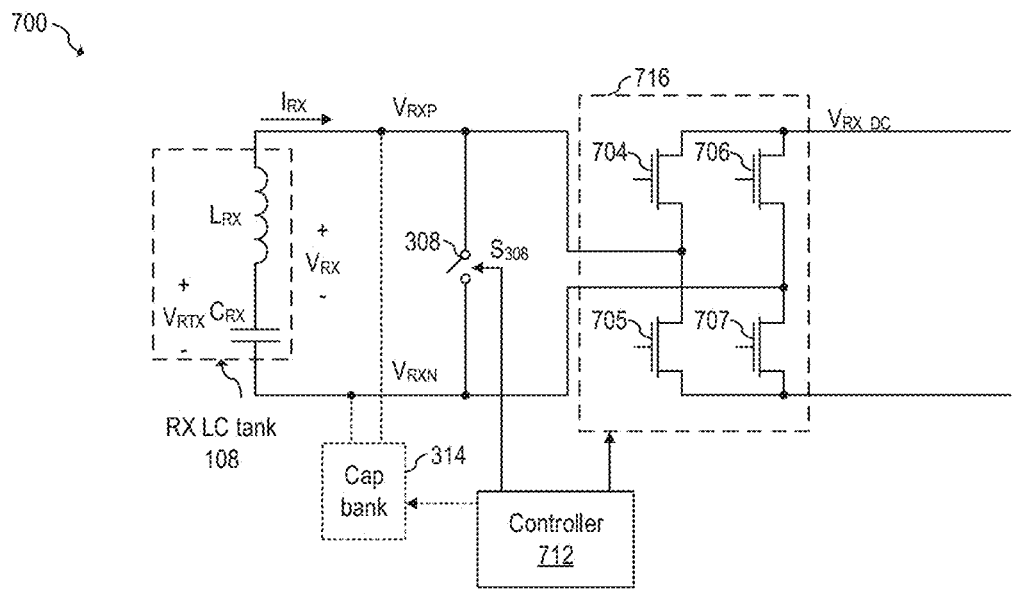
FIG. 7A shows a wireless power receivers, according to an embodiment of the present invention.

FIG. 7A shows wireless power receiver 700, according to an embodiment of the present invention. Wireless power receiver 304 may be implemented as wireless power transmitter 500.

Figure 7B:
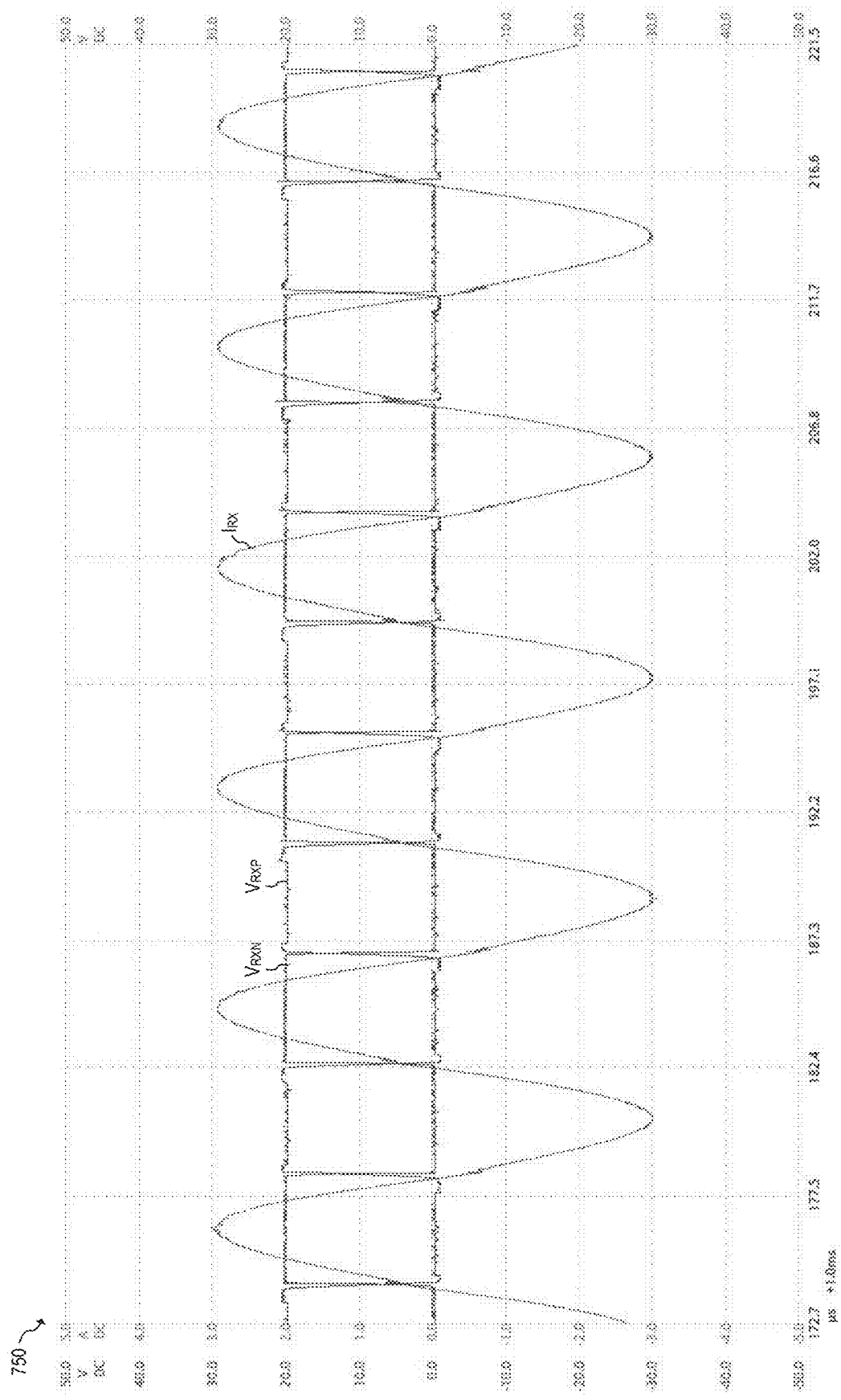
FIG. 7B shows waveforms associated with the LC tank of the wireless power receiver of FIG. 7A during active wireless power transfer, according to an embodiment of the present invention.

Wireless power receiver 700 operates in a similar manner as wireless power receiver 304, and implements rectifier 316 as synchronous rectifier 716, which provides rectification based on the zero-crossing of receiver current $I_{RX}$. FIG. 7B shows waveforms 750 associated with LC tank 108 of wireless power receiver 700 during active wireless power transfer, according to an embodiment of the present invention.

Figure 8:
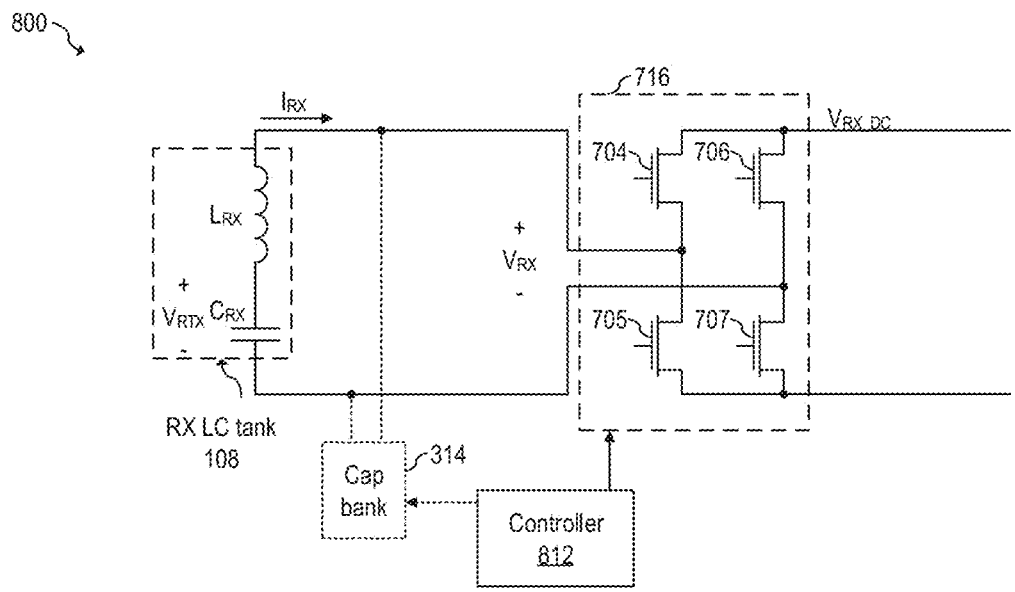
FIGS. 8-9 show wireless power receivers, according to embodiments of the present invention.

In some embodiments, switch 308 may be omitted, and the shorting of LC tank 106 may be achieved, e.g., by turning on transistors 705 and 707 and turning off transistors 704 and 706 (or turning on transistors 704 and 706 and turning off transistors 705 and 707) during the micro-slot. For example, FIG. 8 shows wireless power receiver 800, according to an embodiment of the present invention. Wireless power receiver 304 may be implemented as wireless power receiver 800.

Wireless power receiver 800 operates in a similar manner as wireless power receiver 700. Wireless power receiver 800, however, does not include switch 308, and instead controls transistors 704, 705, 706, and 707, using controller 812, to short LC tank 108 during a micro-slot.

During a micro-slot, since power is not being received with LC tank 108, voltage $V_{RX\_DC}$ at the output of rectifier (e.g., 316, 716) may decrease, as shown in FIG. 4. If, during a micro-slot, voltage $V_{RX\_DC}$ becomes smaller than the peak values of the oscillations of LC tank 108, current may flow from the LC tank to a load coupled to the output of the rectifier, and the characteristics of the oscillations of $I_{RX}$ and $V_{RTX}$ during the micro-slot may be affected (e.g., the voltage peaks of voltage $V_{RX}$ may be clamped or otherwise reduced. Such modifications in the behavior of the oscillation of the LC tank 108 may cause the measurements of the characteristics of the LC tank 108 (e.g., damping coefficient, resonance frequency) to be corrupted or shifted, thereby possibly affecting the determination of the amount of power loss and the detection of foreign objects.

Figure 9:
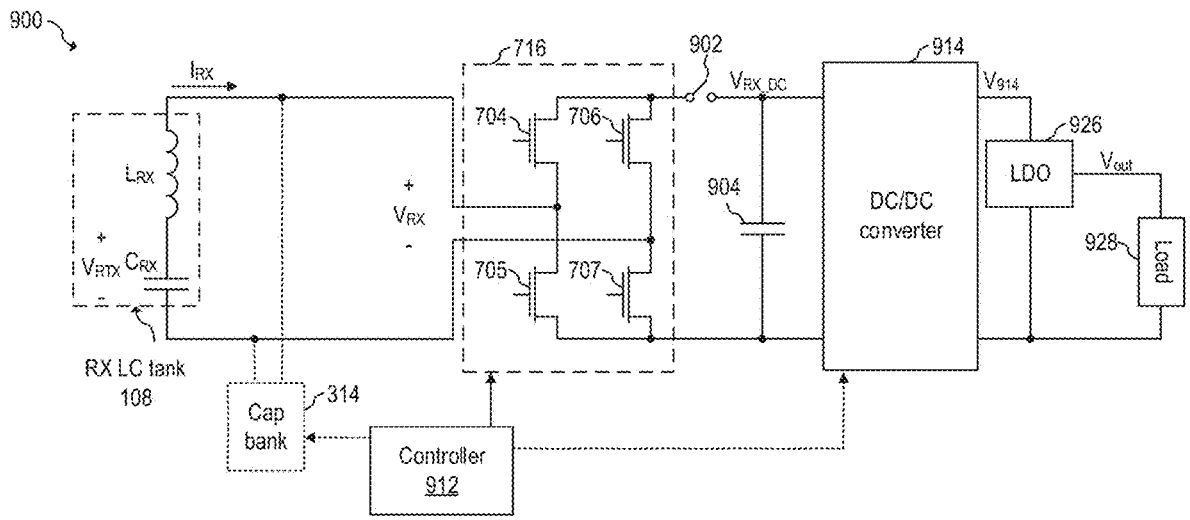

In some embodiments, a switch is used to isolate the LC tank 108 from the circuits coupled to the output of the rectifier. For example, FIG. 9 shows wireless power receiver 900, according to an embodiment of the present invention. Wireless power receiver 304 may be implemented as wireless power receiver 900.

Wireless power receiver 900 operates in a similar manner as wireless power receiver 800. Wireless power receiver 900, however, includes switch 902, e.g., for isolating LC tank 108 during a micro-slot. For example, in some embodiments, switch 902 is closed during charging (e.g., before $t_1$ and after $t_2$ in FIG. 4), and is open at the beginning of the micro-slot (e.g., at time t1 in FIG. 4). In some embodiments, switch 902 is opened at the same time as LC tank 108 is shorted (e.g., by turning on transistors 705 and 707 and turning off transistors 704 and 706).

By isolating RX LC tank 108 from the circuits coupled to the output of the rectifier during a micro-slot, some embodiments advantageously avoid corrupted measurements of the characteristics of the LC tank that may be caused by current consumed by circuits coupled to the output of the rectifier.

FIG. 9 also shows an example of the circuits that can be coupled to the output of rectifier 316. For example, in some embodiments, the output of the rectifier (e.g., 316, 716) is coupled to DC/DC converter 914, which drivers LDO 926, which in turns drive load 928.

Converter 914 is configured to transfer energy from, e.g., filtering capacitor 904 and/or the output of the rectifier (e.g., 316, 716) to the output of converter 914, e.g., and produce a regulated voltage $V_{914}$. In some embodiments, converter 914 may be implemented as a boost, buck, or buck-boost converter. Other switching converters, such as a flyback converter and capacitive charge-pumps and voltage dividers, may also be used.

Regulator 226 may be implemented in any way known in the art, such as and LDO, e.g., by using a regulation transistor to couple voltage $V_{914}$ to voltage $V_{out}$, and an amplifier in a feedback network that senses output voltage $V_{out}$ and controls the control terminal of the regulation transistor to provide a regulated output voltage $V_{out}$. Other implementations are possible.

Load 928 may be, e.g., a custom or general purpose microcontroller, a battery charger, or other electronic circuit, such as other digital, analog, or mixed signal circuit, such as amplifiers, power management circuits, audio circuits, etc. For example, in some embodiments, load 928 is a power converter, e.g., for powering other circuits.

Figure 10A:
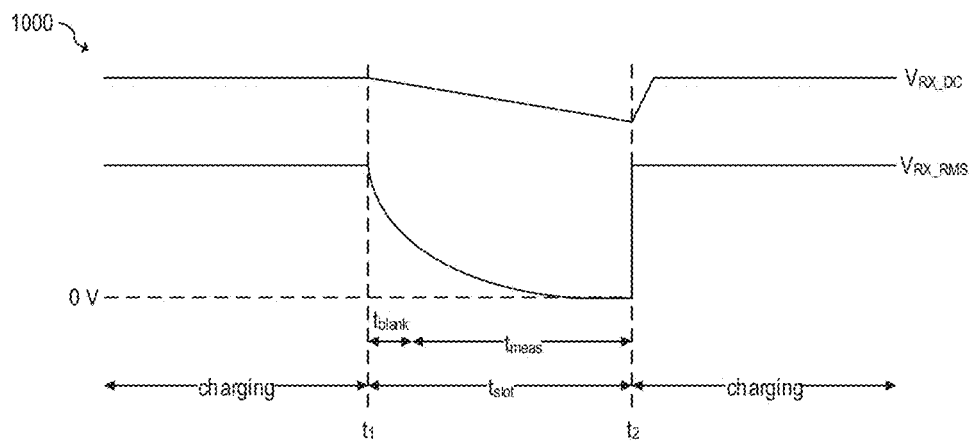
FIG. 10A shows waveforms of a wireless power receiver during a micro-slot, according to an embodiment of the present invention.

In some embodiments, avoiding corrupted measurements caused by voltage $V_{RX\_DC}$ becoming smaller than the peak values of the oscillations of LC tank 108 during a micro-slot is accomplished by removing energy from LC tank 108 at the beginning of the micro-slot and before making measurements of characteristics of LC tank 108. For example, FIG. 10A shows waveforms 1000 of a wireless power receiver (e.g., 304, 700, 800, 900) during a micro-slot, according to an embodiment of the present invention. As shown in FIG. 10A, the RMS voltage $V_{RX\_RMS}$ across LC tank 108 decays (e.g., exponentially) during the micro-slot.

Figure 10B:
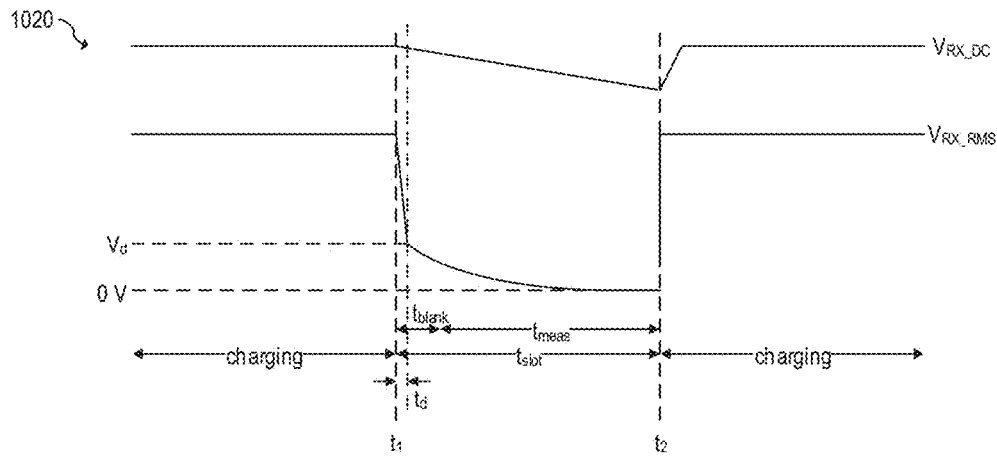
FIG. 10B shows waveforms of a wireless power receiver when removing energy from the LC tank of the receiver at the beginning of the micro-slot, according to an embodiment of the present invention.

FIG. 10B shows waveforms 1020 of a wireless power receiver (e.g., 304, 700, 800, 900) when removing energy from LC tank 108 at the beginning of the micro-slot, according to an embodiment of the present invention. As shown in FIG. 10B, energy is removed from LC tank 108 during time $t_d$, causing the RMS voltage $V_{RX\_RMS}$ to reduce to, e.g., 50% of the RMS current $V_{RX\_RMS}$ before $t_1$. At time $t_1+t_d$, RMS voltage $V_{RX\_RMS}$ continues to decay (e.g., exponentially).

In some embodiments voltage $V_d$ is lower than 50% of the voltage $V_{RX\_RMS}$ immediately before $t_1$, such as 25%, 20%, or lower. By reducing magnitude of voltage $V_{RX\_RMS}$ at the beginning of the micro-slot, some embodiments advantageously allow for measuring characteristics of the LC tank 108 without being affected (e.g., clamped or otherwise modified) by currents flowing into circuits coupled to the output of the rectifier when the output of the rectifier decreases.

In some embodiments, time $t_d$ is, e.g., less than 10 µs, such as 1 µs or lower.

In some embodiments, removing energy from LC tank 108 is accomplished by applying a voltage to the terminals of LC tank 108 that opposes the voltage generated by LC tank 108. For example, in some embodiments, energy is removed from LC tank 108 by switching transistors of synchronous rectifier 716 with a phase shift at or near 180° from normal rectification switching. In some embodiments, the removed energy is provided to a load coupled to the output of the rectifier.

In some embodiments, since TX LC tank 106 and RX LC tank 108 are magnetically coupled, energy may be removed in a similar manner from TX LC tank 106 to cause the removal of energy from LC tank 108. In some embodiments, removing energy from LC tank 108 is accomplished by applying a voltage to the terminals of LC tank 108 that opposes the voltage generated by LC tank 108. For example, in some embodiments, energy is removed from LC tank 108 by switching transistors of driver 514 with a phase shift at or near 180° from normal driving switching.

Figure 11:
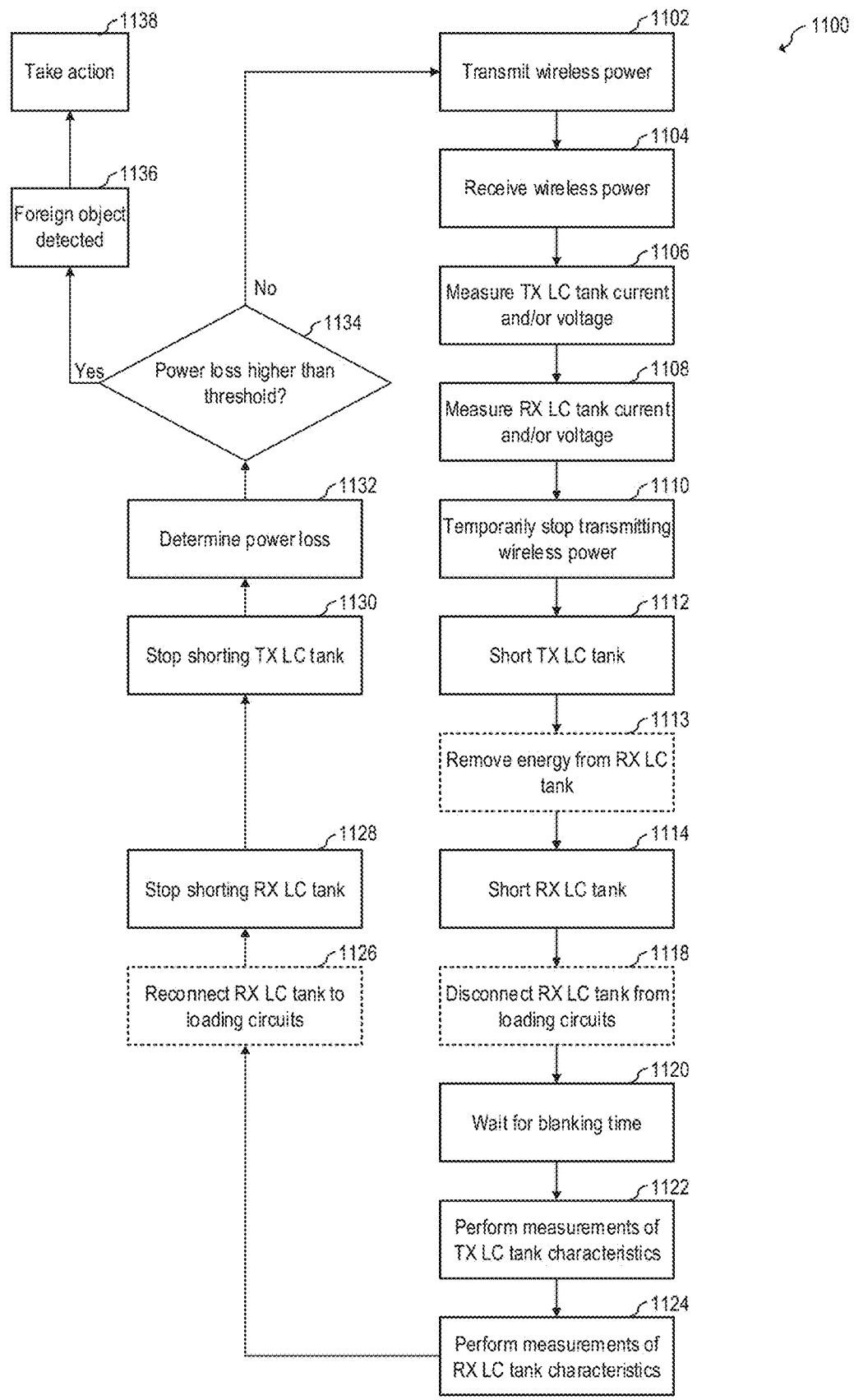
FIGS. 11-15 show flow charts of embodiment methods for determining power loss during wireless power transfer, according to embodiments of the present invention.

FIG. 11 shows a flow chart of embodiment method 1100 for determining power loss during wireless power transfer, according to an embodiment of the present invention. Method 1100 may be implemented, e.g., with wireless charging system 300.

During step 1102, a wireless power transmitter (e.g., 302, 500, or 600) transmits wireless power using a TX LC tank (e.g., 106), e.g., in accordance with the Qi standard, such as versions 1.0, 1.1, 1.2, 1.2.3, 1.2.4 and 1.3, for example.

During step 1104, a wireless power receiver (e.g., 304, 700, 800, 900) receives wireless power from the wireless power transmitter using an RX LC tank (e.g., 108).

During step 1106, a current of the TX LC tank (e.g., $I_{TX}$) and/or a voltage of the TX LC tank (e.g., $V_{CTX}$ and/or $V_{106}$) are measured. During step 1108, a current of the RX LC tank (e.g., $I_{RX}$) and/or a voltage of the RX LC tank (e.g., $V_{CRX}$ and/or $V_{RX}$) are measured. In some embodiments, steps 1106 and 1108 are performed in parallel. In some embodiments, steps 1106 and 1108 are performed sequentially (e.g., 1106 before 1108 or 1108 before 1106).

During step 1110, the wireless power transmitter temporarily stops transmitting wireless power. In some embodiments, such interruption may be, e.g., a micro-slot of, e.g., 200 µs or less.

During step 1112, the TX LC tank is shorted. In some embodiments, the TX LC tank is shorted by closing a switch coupled across the TX LC tank (e.g., 306). In some embodiments, the TX LC tank is shorted by turning on one or more transistors (e.g., 505, 507) of a driver circuit (e.g., 314, 514) coupled to the TX LC tank.

During step 1114, the RX LC tank is shorted. In some embodiments, the RX LC tank is shorted by closing a switch coupled across the RX LC tank (e.g., 308). In some embodiments, the RX LC tank is shorted by turning on one or more transistors (e.g., 705, 707) of a rectifier circuit (e.g., 316, 716) coupled to the RX LC tank.

In some embodiments, steps 1112 and/or 1114 may be performed in parallel with step 1110. In some embodiments, steps 1112 and/or 1114 may be performed (e.g., immediately) after step 1110.

In some embodiments, steps 1112 and 1114 may be performed in parallel. In some embodiments, steps 1112 and 1114 are performed sequentially (e.g., 1112 before 1114 or 1114 before 1112).

During step 1113, energy is removed from the RX LC tank. In some embodiments, energy is removed from the RX LC tank by operating a synchronous rectifier (e.g., 716) to generate a voltage that opposes the voltage of the RX LC tank. In some embodiments, step 1113 may be omitted. For example, in embodiments in which the voltage at the output of rectifier 716 is maintained at a high voltage, such as the same voltage as during active wireless power transfer (e.g., immediately before step 1110) step 113 may be omitted.

Some embodiments may maintain the same voltage at the output of rectifier 716 during the interruption in wireless power transfer by using a battery coupled to the wireless power receiver or by using energy from the capacitance of the wireless power receiver, such as described in co-pending U.S. patent application Ser. No. 17/020,326.

During step 1118, the RX LC tank is disconnected from loading circuits. In some embodiments, RX LC tank is disconnected from loading circuits by opening a switch (e.g., 902).

In some embodiments, step 1114 may be performed in parallel with step 1118. In some embodiments, step 1118 may be omitted.

During step 1120, a blanking time $t_{blank}$ is used to allow for signals (e.g., associated with the TX LC tank and/or RX LC tank) settle before making measurements (e.g., steps 1122 and 1124). In some embodiments, the blanking time of wireless power transmitter is the same as the blanking time of the wireless power receiver. In some embodiments, the blanking time has a fixed duration (e.g., 20 μs). In some embodiments the blanking time may be dynamic (e.g., may be determined when a condition is met).

During step 1122, measurements of TX LC tank characteristics (e.g., $L'_{TX}$, $R'_{LTX}$, $Q'_{TX}$, $f_{o\_TX}$, $\zeta_{TX}$) are performed.

During step 1124, measurements of RX LC tank characteristics (e.g., $L'_{RX}$, $R'_{LRX}$, $Q'_{RX}$, $f_{o\_RX}$, $\zeta_{RX}$) are performed. In some embodiments, the wireless power receiver transmits the measured data to the wireless power transmitter during step 1124 (e.g., using in band or out-of-band communication).

In some embodiments, steps 1122 and 1124 are performed in parallel. In some embodiments, steps 1122 and 1124 are performed sequentially (e.g., 1122 before 1124 or 1124 before 1122).

During step 1126, RX LC tank is reconnected to the loading circuit. In some embodiments, RX LC tank is reconnected to the loading circuit by closing a switch (e.g., 902). In some embodiments (e.g., such as embodiments not implementing step 1118), step 1126 may be omitted.

During step 1128, the RX LC tank short is removed. In some embodiments, the RX LC tank short is removed by opening a switch (e.g., 308). In some embodiments, the RX LC tank short is removed by turning off one or more transistors (e.g., 705, 707) of a rectifier circuit (e.g., 316, 716) coupled to the RX LC tank.

In some embodiments, steps 1126 and 1128 are performed in parallel. In some embodiments, steps 1126 and 1128 are performed sequentially (e.g., 1126 before 1128 or 1128 before 1126).

During step 1130, the TX LC tank short is removed. In some embodiments, the TX LC tank short is removed by opening a switch (e.g., 306). In some embodiments, the TX LC tank short is removed by turning off one or more transistors (e.g., 505, 507) of a driver circuit (e.g., 314, 514) coupled to the TX LC tank.

In some embodiments, steps 1128 and 1130 are performed in parallel. In some embodiments, steps 1128 and 1130 are performed sequentially (e.g., 1128 before 1130 or 1130 before 1128).

During step 1132, the power loss during the wireless power transfer is determined. In some embodiments, a model (e.g., 202) is used for determining the amount of power loss during the wireless power transfer.

In some embodiments, step 1132 may be performed any time after steps 1122 or 1124. For example, in some embodiments, step 1132 may be performed before steps 1126, 1128, and 1130.

During step 1134, the amount of power loss is compared with a threshold. If the determined power loss is lower than the threshold, step 1102 is performed. If the determined power loss is higher than the threshold, a foreign object is detected during step 1136 and an action is taken during step 1138. In some embodiments, the action take during step 1138 may be to stop wireless power transmission, or reduce the amount of power transferred. In some embodiments, no action is taken as a result of detecting a foreign object during step 1136.

Method 1100 may be performed periodically, e.g., every second. In some embodiments, method 1100 is performed only during a calibration process.

Figure 12:
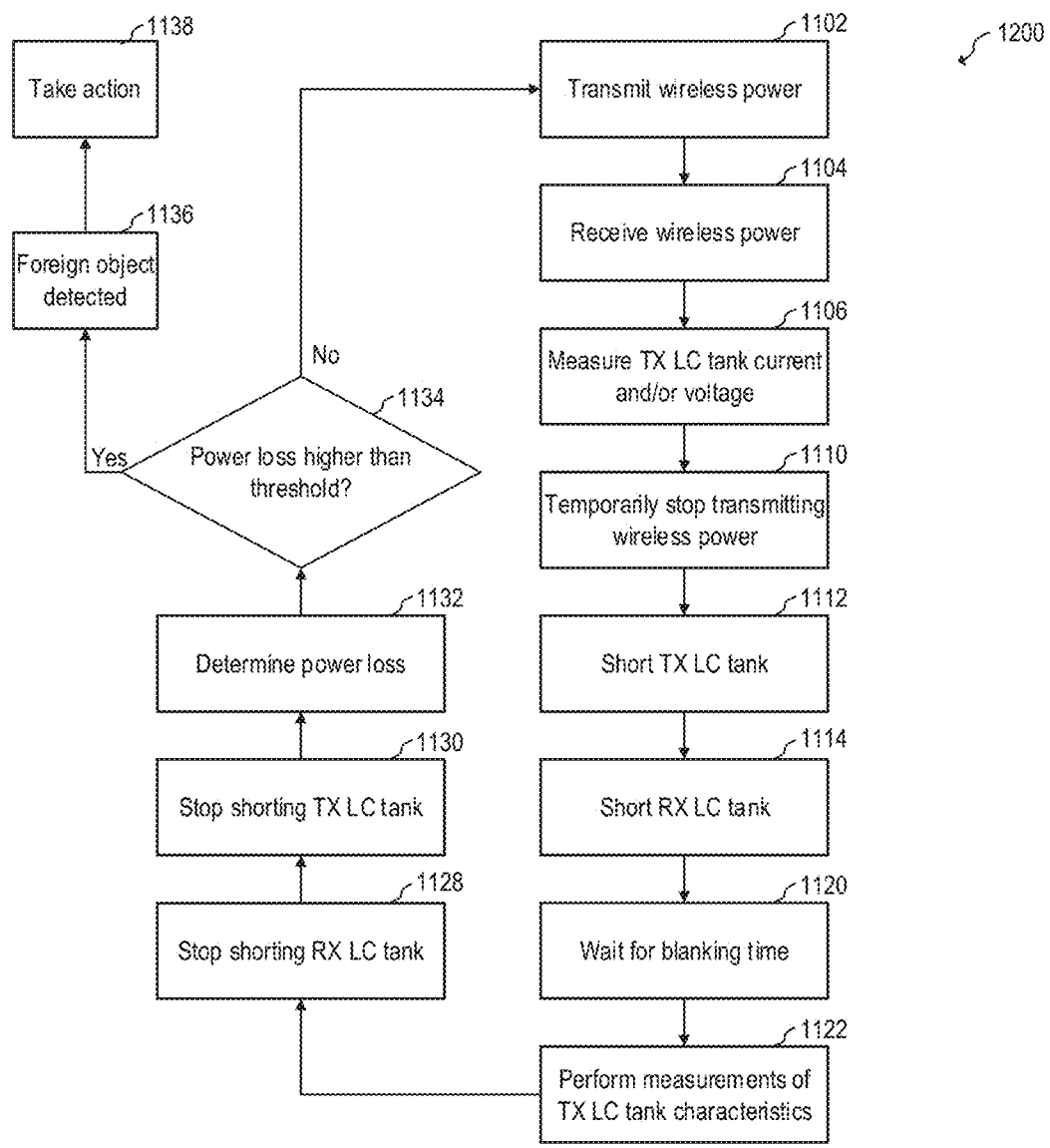

In some embodiments, steps 1108, 1124 may be omitted so that only measurements associated with TX LC tank are performed. For example, FIG. 12 shows a flow chart of embodiment method 1200 for determining power loss during wireless power transfer, according to an embodiment of the present invention. Method 1200 may be implemented, e.g., with wireless charging system 300.

Figure 13:
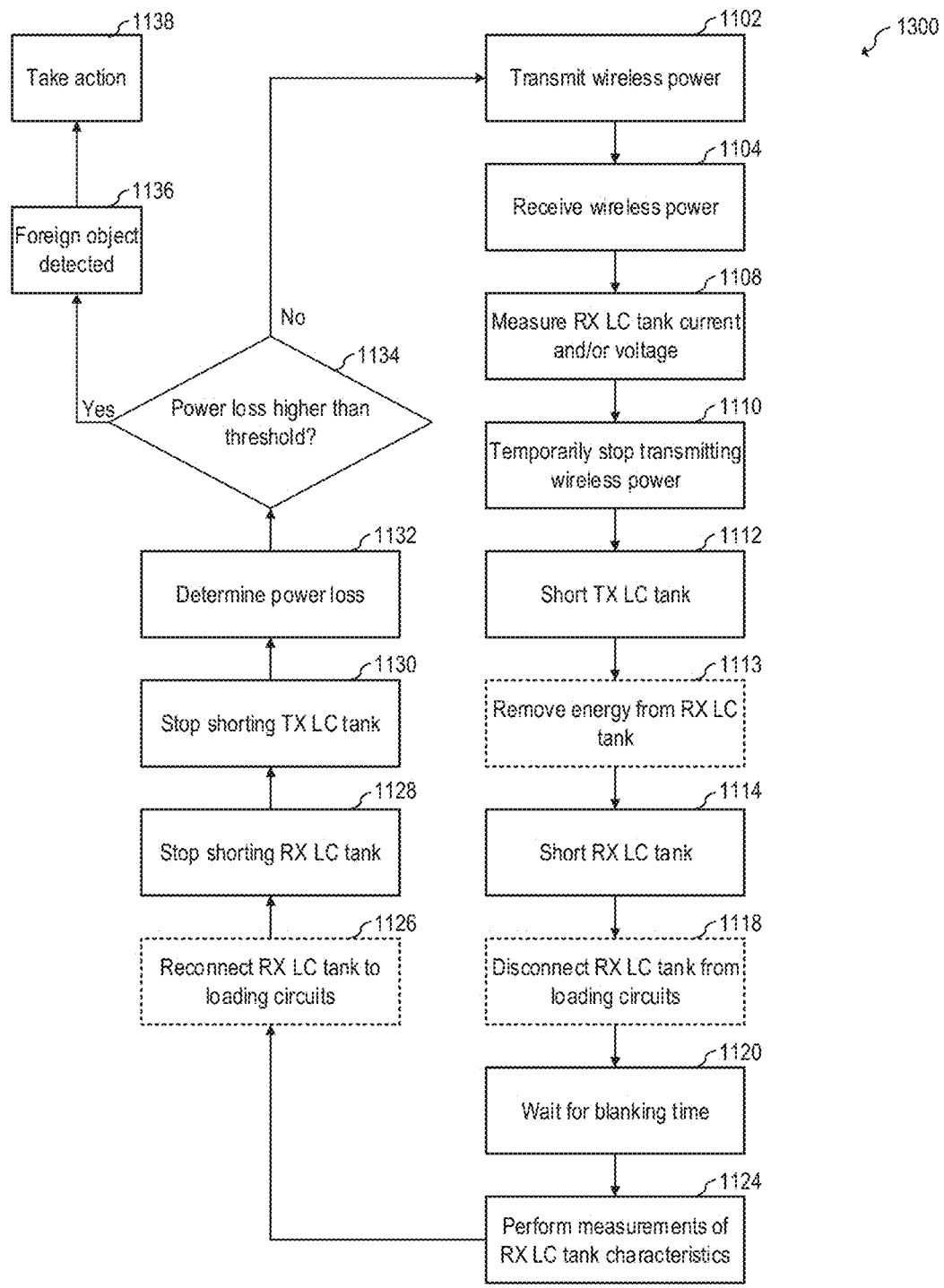

In some embodiments, steps 1106, 1122 may be omitted so that only measurements associated with RX LC tank are performed. For example, FIG. 13 shows a flow chart of embodiment method 1300 for determining power loss during wireless power transfer, according to an embodiment of the present invention. Method 1300 may be implemented, e.g., with wireless charging system 300.

Figure 14:
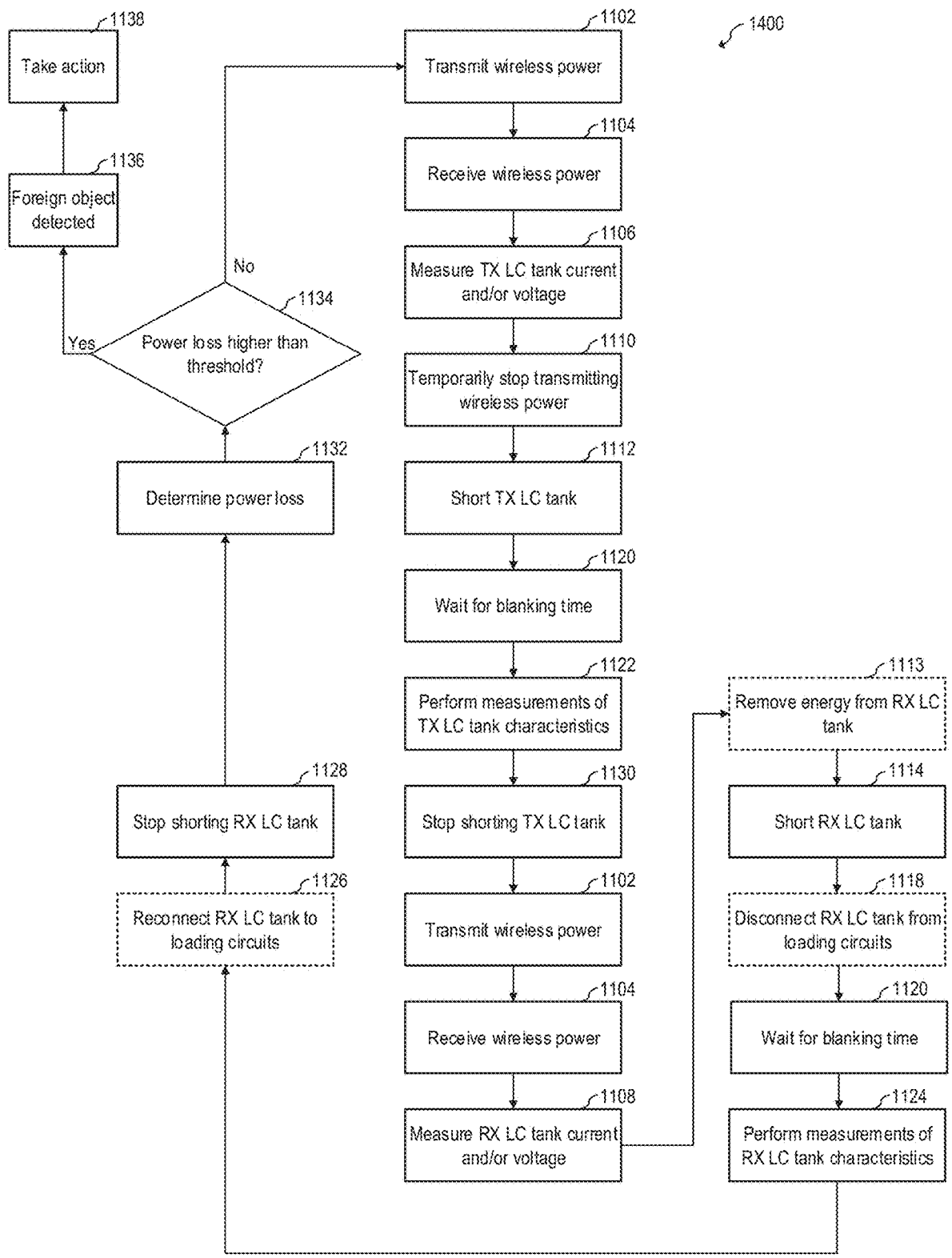

In some embodiments, the shorting of the RX LC tank causes disturbances in the waveforms of the TX LC tank. For example, in some embodiments, the resonant frequencies of the TX LC tank and RX LC tank are different. The frequency of content of one of the LC tanks may be observed in the waveforms of the other LC tank. Some embodiments simply the signal processing for filtering out disturbances caused by the other LC tank by performing TX LC tank measurements and RX LC tank measurements in different micro-slots. For example, FIG. 14 shows a flow chart of embodiment method 1400 for determining power loss during wireless power transfer, according to an embodiment of the present invention. Method 1400 may be implemented, e.g., with wireless charging system 300.

As shown in FIG. 14, two, e.g., consecutive micro-slots are used to measure TX LC tank characteristics and RX LC tank characteristics, respectively.

In some embodiments, both of the steps 1106 and 1108 may be performed before the beginning of each of the two (e.g., consecutive) micro-slots, and the average value may be used during step 1132.

Figure 15:
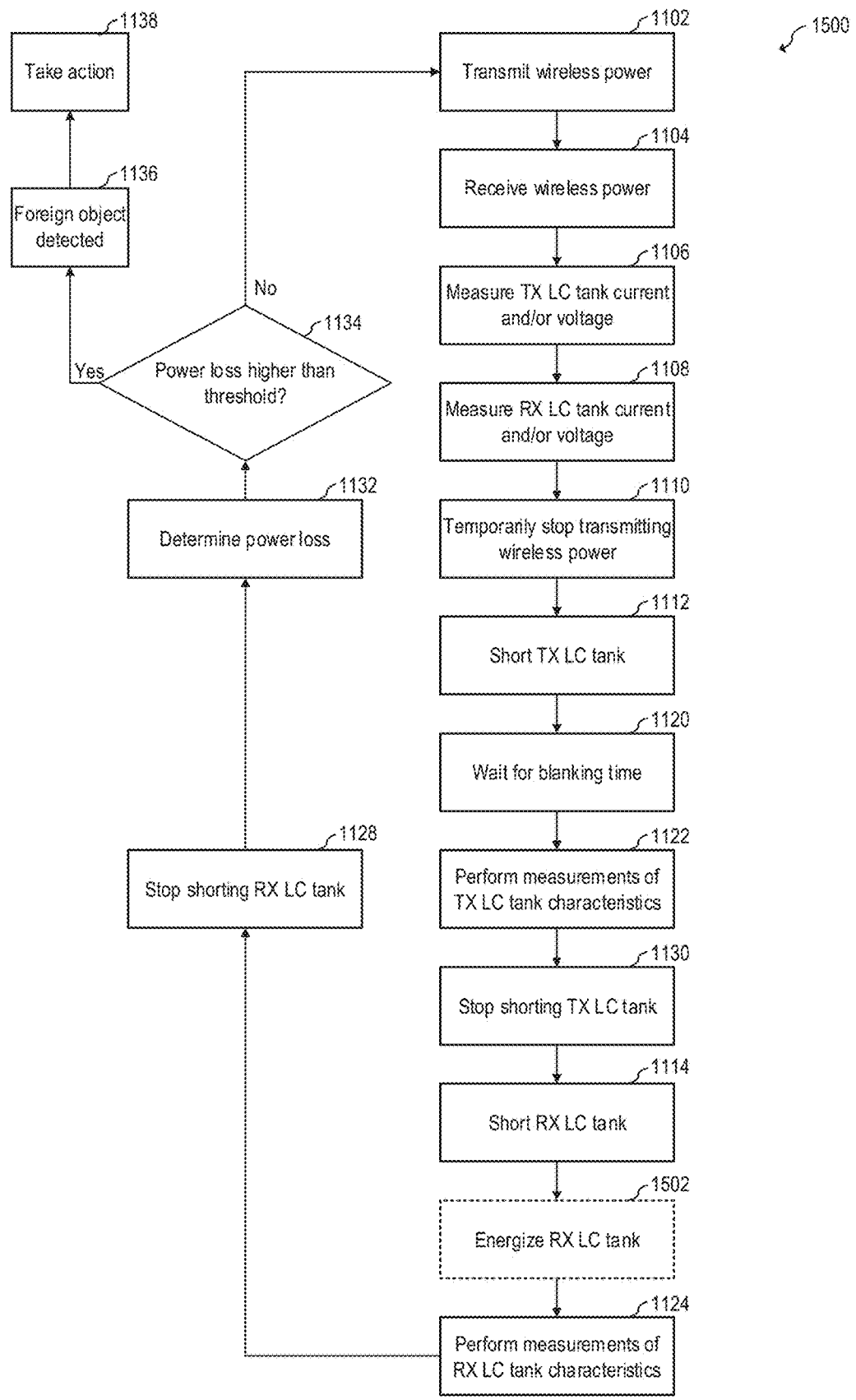

In some embodiments, the measurement of TX LC tank characteristics and RX LC tank characteristics are performed sequentially and without overlapping the shorting of the LC tank in the same micro-slot. For example, in embodiments in which the wireless power receiver has access to a power supply (e.g., such as a battery of a portable device), the RX LC tank may be energized after the short of the TX LC tank is removed to cause the RX LC tank to ring, and the RX LC tank measurement may be performed after the energizing of the RX LC tank. For example, FIG. 15 shows a flow chart of embodiment method 1500 for determining power loss during wireless power transfer, according to an embodiment of the present invention. Method 1500 may be implemented, e.g., with wireless charging system 300.

During step 1502, the RX LC tank is energized. For example, in some embodiments, the RX LC tank is energized by applying a pulse (e.g., a square pulse voltage) across the RX LC tank. In embodiments, the energy for energizing the RX LC tank comes from a battery coupled to wireless power receiver. In some embodiments, the energy for energizing the RX LC tank comes for a capacitor (e.g., 904) coupled to the RX LC tank. In some embodiments, the RX LC tank may have enough energy after step 1114 that step 1502 may be omitted.

In some embodiments, the duration of the micro-slot may be reduced substantially, e.g., from 200 μs to, e.g., 20 μs, (which may be also referred to as a nano-slot) by reducing or eliminating the blanking time $t_{blank}$ such that LC tank measurements are performed during the first few oscillation cycles (e.g., during the first 2 oscillation cycles). In some embodiments, signals associated with the LC tank (e.g., 106 and/or 108) are sampled with a sampling frequency that is higher than the switching frequency of the wireless power transmitter, such as 100 times higher. The characteristics of the LC tank are then extracted from the sampled data by using signal processing techniques.

The first few oscillation cycles (e.g., the first cycle or the first two cycles) of an LC tank (e.g., 106 or 108) may have high frequency content that may cause isolated measurements to be unreliable. In some embodiments, using the first cycle or the first two cycles of the LC tank oscillations to estimate parameters, such as the damping coefficient based on peak detection alone, or resonant frequency based on zero-crossing detection alone, may be unreliable.

In some embodiments, the first cycle or first few cycles of oscillations of the LC tank (e.g., 106 or 108) are oversampled (e.g., 100×) and the resulting data is used to determine one or more parameters of the LC tank, such as damping coefficient and resonance frequency. The determined parameters can then be used in a model, such as model 202, to estimate the power loss.

In some embodiments, the one or more parameters may be determined from the oversampled data by using a mapping function. In some embodiments, the mapping function is generated using a neural network. For example, the neural network may be trained by using supervised learning, in which sets oversampled data are fed to the neural network and the coefficients of the neural network are adjusted based on corresponding pre-labeled data.

In some embodiments, the signals mapped are the voltage across the switch shorting the LC tank (e.g., 306 or 308) and the current flowing through the LC tank (e.g., $I_{TX}$ or $I_{RX}$). In some embodiments, using the voltage across the switch shorting the LC tank to determine the one or more parameters advantageously allows for non-linearities and high frequency content associated with the closing of the switch to be considered, e.g., to allow for removing such content from the current flowing through the LC tank, thereby advantageously allowing a more accurate estimation.

In some embodiments, the data from the waveforms associated with the LC tank may be captured with a ADC. For example, in some embodiments where the switching frequency of the driver (e.g., 314, 514) is 100 kHz, the sampling frequency of the ADC may be, e.g., 10 MHz or higher.

In some embodiments, steps 1122 and/or 1124 of methods 1100, 1200, 1300, 1400, and/or 1500 may be implemented by oversampling waveforms of the respective LC tank and using a mapping function to generate the one or more parameters associated with the LC tank. In such embodiments, step 1120 may be omitted, or the blanking time $t_{blank}$ may be reduced to a fraction of a cycle, such as 10% of a cycle (e.g., 2 μs for a 100 kHz resonant frequency).

Figure 16:
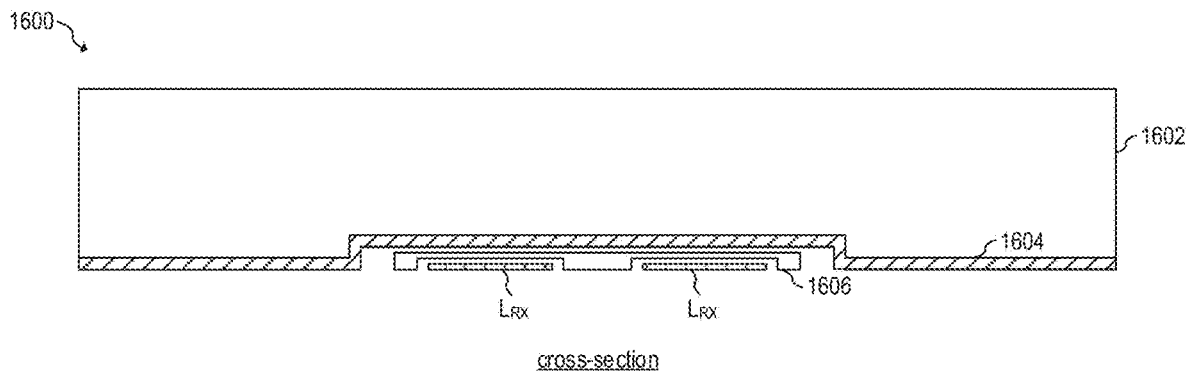
FIG. 16 shows an electronic device, according to an embodiment of the present invention.

In some embodiments, friendly objects, such as friendly metals (e.g., a metallic case of a device) may be present within the charging field during wireless power transfer. For example, FIG. 16 shows electronic device 1600, according to an embodiment of the present invention. Electronic device includes housing 1602, metal shield 1604, ferrite core 1606, and wireless power receiver 304.

In some embodiments, electronic device 1600 is a laptop. Other devices, such as phone, tablets, etc., may also be implemented.

In some embodiments, metal shield 1604 is implemented with aluminum. Other metals, such as metals suitable for improving electromagnetic interference (EMI) performance, may also be used.

In some application, friendly metallic objects in an electronic device, such as metal shield 1604 in electronic device 1600, may be detected as a foreign object by the wireless power transmitter, which may prevent wireless charging from occurring.

In some embodiments, friendly metallic objects are detected measuring a magnetic map (also referred to a magnetic bitmap or bitmap) when the wireless power receiver is at a charging distance from the wireless power transmitter. The measured bitmap is compared with a reference bitmap provided by the wireless power receiver. When the measured bitmap and the reference bitmap match, the wireless power transmitter categorizes the detected metallic objects as friendly metallic objects and proceeds with wireless power transfer steps, e.g., as if the friendly metallic objects were not present.

In some embodiments, the bitmap may be generated by using sensing array capable of measuring magnetic fields in one or more directions. For example, in some embodiments, each "bit" of the bitmap is associated with a sensor of the sensing array. Although the term bit is used, the value associated with the "bit" may have more than 1 bit, such as 4-bits, 8-bits, or more.

Figure 17:
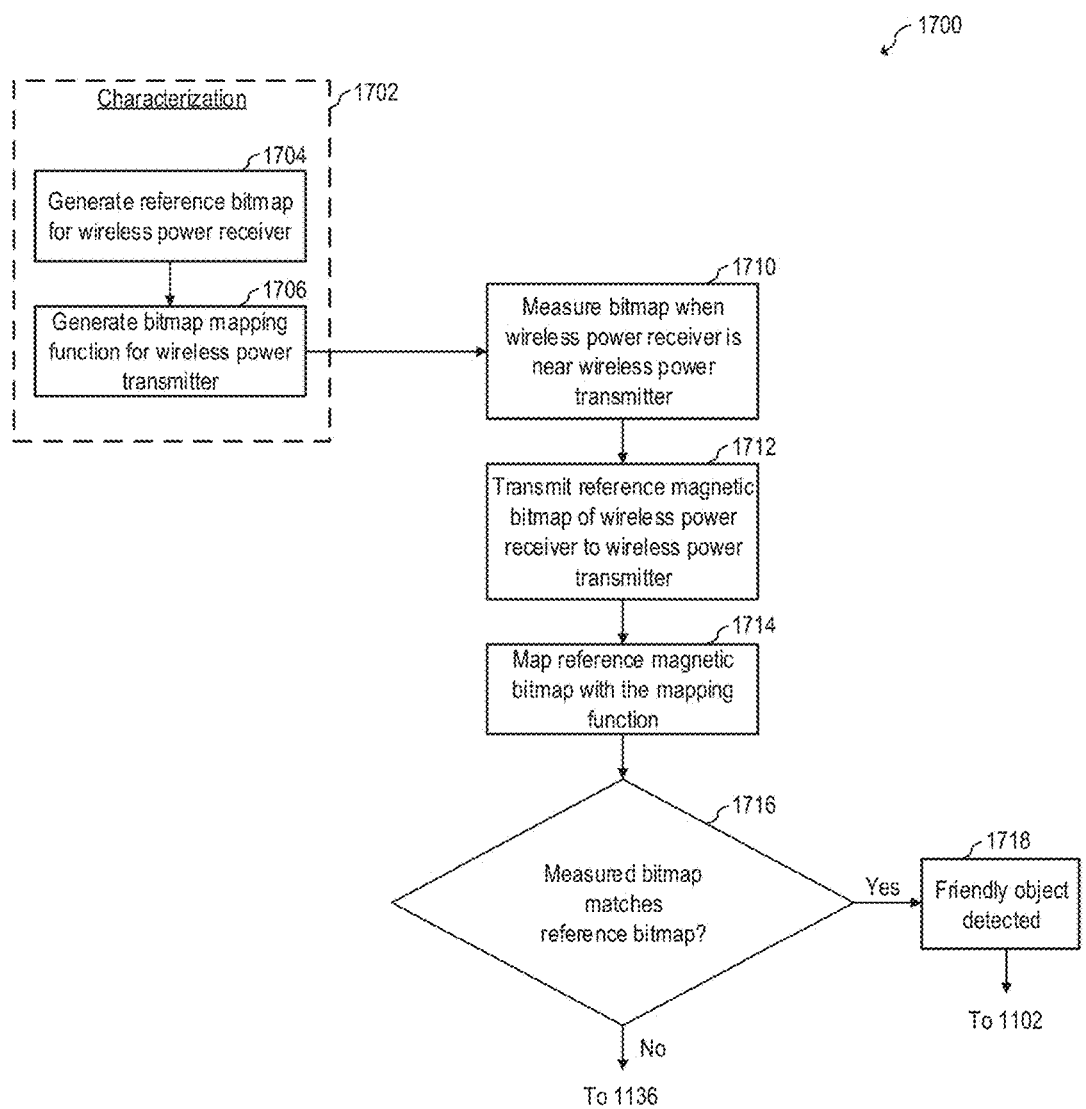
FIG. 17 shows a flow chart of an embodiment method for friendly object detection, according to an embodiment of the present invention.

FIG. 17 shows a flow chart of embodiment method 1700 for friendly object detection, according to an embodiment of the present invention.

In some embodiments, step 1702 may be performed during characterization. For example, in some embodiments, step 1704 may be performed during characterization of the wireless power receiver (e.g., in a lab). Step 1706 may be performed during characterization of the wireless power transmitter (e.g., in the lab). Steps 1710, 1712, 1714, 1716, and 1718 may be performed (e.g., in the field) before wireless power transfer begins. In some embodiments, steps 1710, 1712, 1714, 1716, and 1718 may be performed during wireless power transfer.

During step 1702, a sensing array disposed between a reference wireless power transmitter and an electronic device (e.g., 1600) is used to generate a reference bitmap. For example, a sensing array, e.g., implemented with sensing coils, captures the strength of the magnetic field at different (x,y) locations (e.g., at each location of each of the magnetic sensors of the sensing array) to generate a reference bitmap. Since the amount, type, and distribution of metal affect the magnetic field produced by the reference wireless power transmitter, the resulting reference bitmap may be used to identify the electronic device (or other identical or very similar electronic devices, such as devices of the same model, or other replicas).

In some embodiments, various reference bitmaps are generated with the wireless power receiver located at different locations (e.g., since the characteristics of the magnetic field may be different at the center than at the edges of the wireless charging area and/or at different heights, or when using different coils and/or different power levels).

In some embodiments, the reference bitmap(s) are stored in a memory of the wireless power receiver. In some embodiments, the bitmap(s) are stored as coefficients. In some embodiments, a compressed version of the bitmap(s) are stored and/or transmitted. For example, an equation may be used to represent the magnetic field instead of all way bits of the bitmap.

In some embodiments, each bitmap of the wireless power receiver also includes information about nominal values of $L_{RX}$, $R_{LRX}$, and $Q_{RX}$ (and/or other values associated with the RX LC tank). In such embodiments, such nominal values may be used when performing method foreign object detection using, e.g., model 202, e.g., during step 1132 in methods 1100, 1200, 1300, 1400, or 1500.

During step 1706, a bitmap mapping function is generated for a wireless power transmitter (e.g., 302, 500, or 600). For example, similarly to how the characteristics (e.g., metal distribution) of a wireless power receiver may affect the strength and distribution of the magnetic field, the characteristics of the wireless power transmitter (e.g., metal distribution, size of transmitting coil(s) $L_{TX}$, etc.) may affect the strength and distribution of the magnetic field. To allow for comparing a bitmap generated with a reference wireless transmitter with a bitmap generated with the wireless power transmitter, a mapping function may be used to convert the bitmap measured by the wireless power transmitter so that it "looks" as if it was generated with the reference wireless power transmitter, or to converter a reference bitmap generated with the reference wireless power transmitter so that it "looks" as if it was generated with the wireless power transmitter.

In some embodiments, the mapping function is generated by generating a first set of one or more bitmaps with the reference wireless power transmitter and a reference wireless power receiver. Then generate a second set of one or more bitmaps with the wireless power transmitter and the reference wireless power receiver, where the physical configuration of the wireless power receiver and transmitter (e.g., x,y,z locations) is the same during the generating of the first and second sets of bitmaps. A mapping function may then be generated that converts the bitmaps of the first set to be equal to the bitmaps of the second set or that converts the bitmaps of the second set to be equal to the bitmaps of the first set.

In some embodiments, the mapping function may be generated using simulation data instead of, or in addition to, measurements performed with the reference wireless power transmitter and/or reference wireless power receiver.

In some embodiments in which the wireless power transmitter and the reference wireless power transmitter are equal (or otherwise have the same magnetic signature), step 1706 may be omitted.

During step 1710, the wireless power transmitter measures a bitmap when the wireless power receiver is at a charging distance from the wireless power transmitter.

During step 1712, the wireless power receiver transmits the stored reference bitmap(s) to the wireless power transmitter (e.g., using in-band communication or out-of-band communication). In some embodiments, the bitmaps transmitted by the wireless power receiver to the wireless power transmitter may be a subset of all the reference bitmaps stored in the memory of the wireless power receiver. For example, if the transmitter is using a particular coil (e.g., a 30 W coil) of two or more possible coils, such information may be transmitted to the wireless power receiver, and the wireless power receiver may transmit reference bitmaps that correspond to the particular coil.

In some embodiments, steps 1710 and 1712 are performed in parallel. In some embodiments, steps 1710 and 1712 are performed sequentially (e.g., 1710 before 1712 or 1712 before 1710).

During step 1714, the reference bitmap(s) received from the wireless power receiver are mapped using the mapping function. In some embodiments, the wireless power transmitter uses the measured bitmap to detect the location of the wireless power receiver and only maps the reference bitmap that corresponds to the detected location. In some embodiments, the location of the wireless power receiver may be determined based on changes in the direction of the magnetic field and changes in the strength of the magnetic field of a plurality of bits of the measured bitmap.

In some embodiments that omit step 1706, step 1714 may be omitted.

During step 1716, the measured bitmap is compared with the (e.g., mapped) reference bitmap. The bitmap comparison may be performed, e.g., by using mean-square error. Other comparison methods may also be used.

When the measured bitmap and the (e.g., mapped) reference bitmap match (e.g., when the mean-square error is lower than a threshold), then the objects are categorized as friendly objects during step 1718.

In some embodiments, the presence of friendly objects may result in power loss (e.g., step 1134). To prevent that the power loss associated with friendly object triggers a foreign object detection, some embodiments mask the presence of friendly objects by calibrating-in the friendly objects. For example, in some embodiments, the calibration process is performed with an electronic device with friendly objects (e.g., 1600) is at a charging distance (i.e., at a distance that is close enough so that the wireless power transmitter can wirelessly transfer power to the electronic device, or closer) the wireless power transmitter so that magnetic field disturbances caused by the presence of the friendly objects are compensated for (e.g., so that the power loss determined during step 1134 after the calibration is zero when the electronic device with friendly objects is present, and no other metal is present).

During the calibration process, measurements of one or more parameters received as input for model 202 (e.g., $L'_{TX}$, $R'_{LTX}$, and/or $Q'_{TX}$) are measured, and the nominal values may be updated, or the gain and/or offset applied to the input values before further processing inside model 202 is adjusted so that the measured value during the calibration process matches the nominal value. In some embodiments, by performing the calibration process in the presence of friendly objects, the power loss associated with the friendly objects is compensated for and not considered when determining power loss, e.g., for purposes of detecting foreign objects (e.g., during step 1134 in methods 1100, 1200, 1300, 1400, or 1500).

Figure 18A:
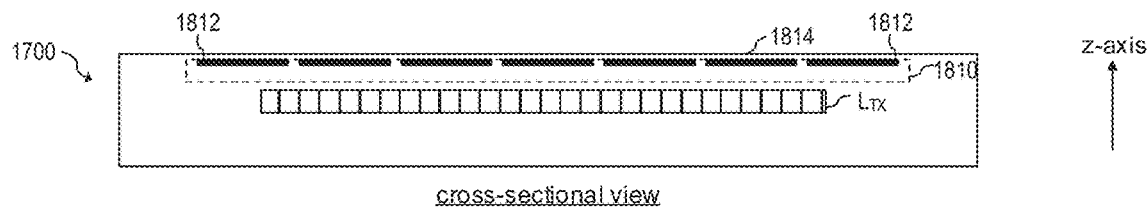
FIG. 18A shows a cross-sectional view of a wireless power transmitter, according to an embodiment of the present invention.
Figure 18B:
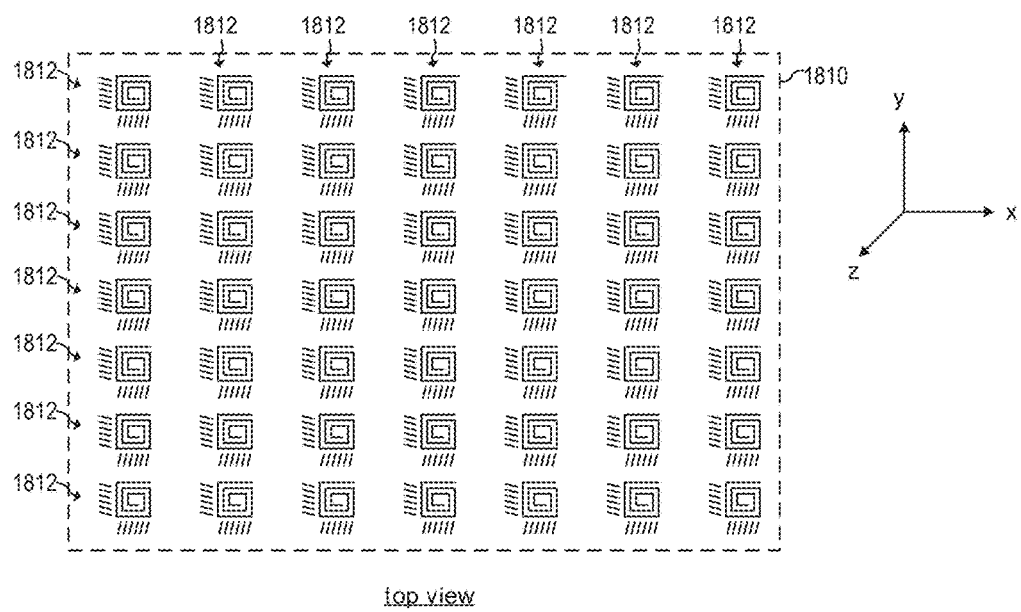
FIG. 18B shows top view of the sensing array of FIG. 18A, according to an embodiment of the present invention.

FIG. 18A shows a cross-sectional view of wireless power transmitter 1800, according to an embodiment of the present invention. Wireless power transmitter 302 may be implemented as wireless power transmitter 1800. FIG. 18B shows top view of sensing array 1810, according to an embodiment of the present invention. Sensing array 1810 may be used to generate one or more bitmaps, e.g., during step 1704, 1706, 1710, and/or 1712.

Figures 18C, 18D:
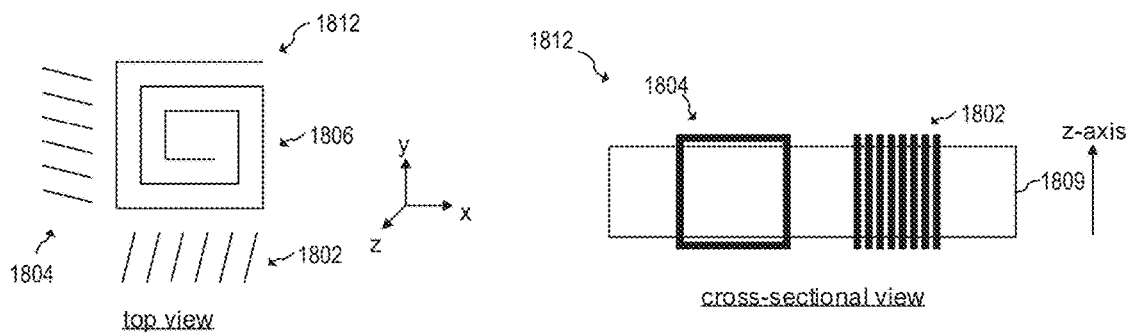
FIGS. 18C and 18D show a top-view and a cross-sectional view of the sensing coil of FIG. 18B, respectively, according to an embodiment of the present invention.

FIGS. 18C and 18D show a top-view and a cross-sectional view of sensing coil 1812, respectively, according to an embodiment of the present invention. FIGS. 18A-18D may be understood together.

As shown in FIG. 18A, wireless power transmitter 1800 includes sensing array 1810 disposed between transmitter coil $L_{TX}$ and charging surface 1814 (e.g., so that sensing array 1810 is between transmitter coil $L_{TX}$ and receiver coil LX during wireless power transfer). As shown in FIG. 18B, sensing array 1810 includes a plurality of sensors 1812 arranged in rows and columns. In this embodiment, seven rows and seven columns equally spaced are shown. In some embodiments, a different numbers of rows and columns (e.g., six rows and five columns) may be used. In some embodiments, the spacing between each of the plurality of sensors 112 may be different. In some embodiments, a different shape (other than a square or rectangular shape) may be used to implement sensing array 1810. For example, in some embodiments, a circular shape may be used.

Each sensor 1812 includes one or more coils. Each of the coils generates a voltage that is related (e.g., proportional) to the strength of the magnetic field flowing through the core area (magnetic axis) of the coil. By measuring the voltage across terminals of each of the coils, it is possible to generate a map of the magnetic field. The voltage across terminals of each coil may be measured, e.g., by using a differential amplifier coupled to an ADC. Other measurement circuits and methods may also be used.

Each of sensors 1812, e.g., as shown in FIG. 18B, includes three coils; one for each axis of a three-dimensional (3D) space (i.e., x-axis, y-axis, and z-axis). By using three coils per sensor 1812, it is possible to detect the strength and orientation in the 3D space of the magnetic fields. Some embodiments may be implemented with one or more of sensors 1812 implementing a single coil (e.g., for the z-axis), or two coils. In some embodiments, a Hall sensor may be used instead of or in addition to the coils of sensor 1812 to detect the strength of the magnetic field. Other magnetically sensitive element may also be used.

Sensing array 1810 may be implemented, for example, in a PCB. For example, in a PCB (e.g., 1809), the coils of each of sensors 1812 may be implemented using traces or a combination of traces and vias.

As shown in FIG. 17C, coil 1802 is capable of detecting the strength of the magnetic field in the x-axis, coil 1804 is capable of detecting the strength of the magnetic field in the y-axis, and coil 1806 is capable of detecting the strength of the magnetic field in the z-axis. As shown in FIG. 17D, coil 1804 is implemented with a combination of traces and vias going through PCB 1809. Coil 1802 is implemented with traces (not shown) and vias. Coil 1806 (not shown) is implemented with traces. In some embodiments, coil 1806 may be implemented using partial vias, thereby having turns in inner layers of PCB 1809.

Example embodiments of the present invention are summarized here. Other embodiments can also be understood from the entirety of the specification and the claims filed herein.

Example 1. A method including: wirelessly transmitting power using a transmitter LC tank; wirelessly receiving power from the transmitter LC tank using a receiver LC tank; interrupting wirelessly transmitting power for a slot period; during the slot period, shorting the receiver LC tank; during the slot period and after shorting the receiver LC tank, measuring a transmitter signal associated with the transmitter LC tank; determining a power loss associated with the wirelessly transmitting power based on the measured transmitter signal; and detecting a metallic object based on the determined power loss.

Example 2. The method of example 1, further including, during the slot period, shorting the transmitter LC tank at the same time as shorting the receiver LC tank.

Example 3. The method of one of examples 1 or 2, where wirelessly transmitting power using the transmitter LC tank includes driving the transmitter LC tank with first and second half-bridges respectively coupled to first and second terminals of the transmitter LC tank, the method further including, during the slot period, shorting the transmitter LC tank by turning on a first transistor of the first half-bridge and a second transistor of the second half-bridge.

Example 4. The method of one of examples 1 to 3, where measuring the transmitter signal includes measuring a first current flowing through the transmitter LC tank.

Example 5. The method of one of examples 1 to 4, where measuring the transmitter signal includes measuring a first voltage across a capacitor of the transmitter LC tank.

Example 6. The method of one of examples 1 to 5, further including determining a transmitter resonant frequency of the transmitter LC tank from the measured transmitter signal, where determining the power loss includes determining the power loss based on the transmitter resonant frequency.

Example 7. The method of one of examples 1 to 6, further including determining a transmitter damping coefficient of the transmitter LC tank from the measured transmitter signal, where determining the power loss includes determining the power loss based on the transmitter damping coefficient.

Example 8. The method of one of examples 1 to 7, further including measuring an active transmitter current flowing through the transmitter LC tank before interrupting wirelessly transmitting power, where the power loss is further based on the active transmitter current.

Example 9. The method of one of examples 1 to 8, further including, determining a transmitter resistance based on the measured transmitter signal, where determining the power loss is based on the active transmitter current times a difference between the determined transmitter resistance and a nominal transmitter resistance.

Example 10. The method of one of examples 1 to 9, where detecting the metallic object includes detecting the metallic object when the determined power loss is higher than a threshold.

Example 11. The method of one of examples 1 to 10, further including, during the slot period, waiting for a blanking time before measuring the transmitter signal.

Example 12. The method of one of examples 1 to 11, where the duration of the blanking time lasts for at least two oscillations of the transmitter LC tank.

Example 13. The method of one of examples 1 to 12, where shorting the receiver LC tank includes closing a switch directly connected across terminals of the receiver LC tank.

Example 14. The method of one of examples 1 to 13, further including, during the slot period, shorting the transmitter LC tank by closing a switch directly connected across terminals of the transmitter LC tank.

Example 15. The method of one of examples 1 to 14, where the slot period is between 100 µs and 200 µs.

Example 16. The method of one of examples 1 to 15, where the slot period is lower than 50 µs.

Example 17. The method of one of examples 1 to 16, where measuring the transmitter signal includes sampling the transmitter signal at a sampling frequency of at least 100 times a driving frequency of the transmitter LC tank.

Example 18. The method of one of examples 1 to 17, further including sampling a voltage across a switch coupled across the transmitter LC tank at the sampling frequency, where determining the power loss is further based on the sampled voltage.

Example 19. A method including: wirelessly transmitting power using a transmitter LC tank of a wireless power transmitter; wirelessly receiving power from the transmitter LC tank using a receiver LC tank of a wireless power receiver; interrupting wirelessly transmitting power for a slot period; during the slot period, measuring a receiver signal associated with the receiver LC tank; transmitting receiver data based on the measured receiver signal to the wireless power transmitter; determining a power loss associated with the wirelessly transmitting power based on the measured receiver signal; and detecting a metallic object based on the determined power loss.

Example 20. The method of example 19, further including, during the slot period, shorting the receiver LC tank before measuring the receiver signal.

Example 21. The method of one of examples 19 or 20, where transmitting the receiver data includes using a capacitor bank coupled to the receiver LC tank.

Example 22. The method of one of examples 19 to 21, further including, during the slot period, shorting the transmitter LC tank before measuring the receiver signal.

Example 23. The method of one of examples 19 to 22, where wirelessly receiving power using the receiver LC tank includes using a synchronous rectifier coupled to the receiver LC tank.

Example 24. The method of one of examples 19 to 23, further including, during the slot period, shorting the receiver LC tank by turning on first and second transistors of the synchronous rectifier.

Example 25. The method of one of examples 19 to 24, where measuring the receiver signal includes measuring a first current flowing through the receiver LC tank or a first voltage across a capacitor of the receiver LC tank.

Example 26. The method of one of examples 19 to 25, further including determining a transmitter resonant frequency of the receiver LC tank from the measured receiver signal, where determining the power loss includes determining the power loss based on the transmitter resonant frequency.

Example 27. The method of one of examples 19 to 26, further including determining a receiver damping coefficient of the receiver LC tank from the measured receiver signal, where determining the power loss includes determining the power loss based on the receiver damping coefficient.

Example 28. The method of one of examples 19 to 27, further including measuring an active receiver current flowing through the receiver LC tank before interrupting wirelessly transmitting power, where the power loss is further based on the active receiver current.

Example 29. The method of one of examples 19 to 28, further including determining a receiver resistance based on the measured receiver signal, where determining the power loss is based on the active receiver current times a difference between the determined receiver resistance and a nominal receiver resistance.

Example 30. The method of one of examples 19 to 29, further including: measuring an active transmitter current flowing through the transmitter LC tank before interrupting wirelessly transmitting power; and during the slot period, measuring a transmitter signal associated with the transmitter LC tank, and determining a transmitter resistance based on the measured transmitter signal, where determining the power loss is further based on the active transmitter current times a difference between the determined transmitter resistance and a nominal transmitter resistance.

Example 31. The method of one of examples 19 to 30, further including, during the slot period, removing energy from the receiver LC tank before measuring the receiver signal.

Example 32. The method of one of examples 19 to 31, where removing energy from the receiver LC tank includes switching transistors of a synchronous rectifier coupled to the receiver LC tank.

Example 33. The method of one of examples 19 to 32, where removing energy from the receiver LC tank includes switching transistors of a driver coupled to the transmitter LC tank.

Example 34. The method of one of examples 19 to 33, further including, during the slot period, disconnecting the receiver LC tank from a loading circuit before measuring the receiver signal.

Example 35. The method of one of examples 19 to 34, where disconnected the receiver LC tank from the loading circuit includes opening a switch coupled between a rectifier and the loading circuit.

Example 36. The method of one of examples 19 to 35, further including periodically interrupting wirelessly transmitting power for the slot period.

Example 37. The method of one of examples 19 to 36, further including energizing the receiver LC tank by providing a pulse using transistors of a rectifier coupled to the receiver LC tank before measuring the receiver signal.

Example 38. A method including: wirelessly transmitting power using a transmitter LC tank; wirelessly receiving power from the transmitter LC tank using a receiver LC tank; interrupting wirelessly transmitting power for a first slot period; during the first slot period, measuring a transmitter signal associated with the transmitter LC tank; after interrupting wirelessly transmitting power for the first slot period, resuming wirelessly transmitting power using the transmitter LC tank; interrupting wirelessly transmitting power for a second slot period; during the second slot period, measuring a receiver signal associated with the receiver LC tank; after interrupting wirelessly transmitting power for the second slot period, resuming wirelessly transmitting power using the transmitter LC tank; determining a power loss associated with the wirelessly transmitting power based on the measured transmitter signal and the measured receiver signal; and detecting a metallic object based on the determined power loss.

Example 39. The method of example 38, where interrupting wirelessly transmitting power for the second slot period includes interrupting wirelessly transmitting power for the second slot period after interrupting wirelessly transmitting power for the first slot period.

Example 40. The method of one of examples 38 or 39, where a duration of the first slot period is substantially equal to a duration of the second slot period.

Example 41. A method including: measuring a magnetic bitmap using a sensing array of a wireless power transmitter; receiving a reference magnetic bitmap from a wireless power receiver; determining whether the measured magnetic bitmap and the reference magnetic bitmap match; and when the measured magnetic bitmap and the reference magnetic bitmap match, masking a presence of metals associated with the wireless power receiver in a wireless charging field associated with the wireless power transmitter during foreign object detection.

Example 42. The method of example 41, further including generating a mapped reference magnetic bitmap by applying a mapping function to the reference magnetic bitmap.

Example 43. The method of one of examples 41 or 42, further including generating the mapping function by: measuring a first magnetic bitmap when a reference wireless power receiver is at a charging distance from a reference wireless power transmitter; measuring a second magnetic bitmap when the reference wireless power receiver is at a charging distance from a wireless power transmitter; and generating the mapping function based on the first magnetic bitmap and the second magnetic bitmap.

Example 44. The method of one of examples 41 to 43, where determining whether the measured magnetic bitmap and the reference magnetic bitmap match includes determining the mean square error between the measured magnetic bitmap and the reference magnetic bitmap and comparing the determined mean square error with a threshold.

Example 45. The method of one of examples 41 to 44, where masking the presence of metals associated with the wireless power receiver includes calibrating a model for performing the foreign object detection based on measurements performed when the wireless power receiver is within the wireless charging field associated with the wireless power transmitter.

Example 46. The method of one of examples 41 to 45, further including generating the reference magnetic bitmap by using a reference wireless power transmitter.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method comprising:
wirelessly transmitting power using a transmitter LC tank of a transmitter;
wirelessly receiving the power from the transmitter LC tank using a receiver LC tank of a receiver;
interrupting wirelessly transmitting the power for a slot period so that no power is actively transferred by the transmitter LC tank from the transmitter during the slot period;
during the slot period, shorting the receiver LC tank;
during the slot period and after shorting the receiver LC tank, measuring a transmitter signal associated with the transmitter LC tank;
determining a power loss associated with wirelessly transmitting the power based on the measured transmitter signal; and
detecting a metallic object based on the determined power loss.

2. The method of claim 1, further comprising, during the slot period, shorting the transmitter LC tank at the same time as shorting the receiver LC tank.

3. The method of claim 1, wherein wirelessly transmitting the power using the transmitter LC tank comprises driving the transmitter LC tank with first and second half-bridges respectively coupled to first and second terminals of the transmitter LC tank, the method further comprising, during the slot period, shorting the transmitter LC tank by turning on a first transistor of the first half-bridge and a second transistor of the second half-bridge.

4. The method of claim 1, wherein the measuring the transmitter signal comprises measuring a first current flowing through the transmitter LC tank.

5. The method of claim 1, wherein the measuring the transmitter signal comprises measuring a first voltage across a capacitor of the transmitter LC tank.

6. The method of claim 1, further comprising determining a transmitter resonant frequency of the transmitter LC tank from the measured transmitter signal, wherein the determining the power loss comprises determining the power loss based on the transmitter resonant frequency.

7. The method of claim 1, further comprising determining a transmitter damping coefficient of the transmitter LC tank from the measured transmitter signal, wherein the determining the power loss comprises determining the power loss based on the transmitter damping coefficient.

8. The method of claim 1, further comprising measuring an active transmitter current flowing through the transmitter LC tank before interrupting wirelessly transmitting the power, wherein the power loss is further based on the active transmitter current.

9. The method of claim 8, further comprising, determining a transmitter resistance based on the measured transmitter signal, wherein the determining the power loss is based on the active transmitter current times a difference between the determined transmitter resistance and a nominal transmitter resistance.

10. The method of claim 1, wherein the detecting the metallic object comprises detecting the metallic object when the determined power loss is higher than a threshold.

11. The method of claim 1, further comprising, during the slot period, waiting for a blanking time before the measuring the transmitter signal.

12. The method of claim 11, wherein a duration of the blanking time lasts for at least two oscillations of the transmitter LC tank.

13. The method of claim 1, wherein the shorting the receiver LC tank comprises closing a switch directly connected across terminals of the receiver LC tank.

14. The method of claim 1, further comprising, during the slot period, shorting the transmitter LC tank by closing a switch directly connected across terminals of the transmitter LC tank.

15. The method of claim 1, wherein the slot period is between 100 μs and 200 μs.

16. The method of claim 1, wherein the slot period is lower than 50 μs.

17. The method of claim 1, wherein the measuring the transmitter signal comprises sampling the transmitter signal at a sampling frequency of at least 100 times a driving frequency of the transmitter LC tank.

18. The method of claim 17, further comprising sampling a voltage across a switch coupled across the transmitter LC tank at the sampling frequency, wherein the determining the power loss is further based on the sampled voltage.

19. A method comprising:
wirelessly transmitting power to a receiver LC tank of a receiver using a transmitter LC tank of a transmitter;
interrupting wirelessly transmitting the power for a slot period so that no power is actively transferred by the transmitter LC tank from the transmitter during the slot period;
during the slot period and after the receiver LC tank was shorted, measuring a transmitter signal associated with the transmitter LC tank;
determining a power loss associated with wirelessly transmitting the power based on the measured transmitter signal; and
detecting a metallic object based on the determined power loss.

20. The method of claim 19, further comprising, during the slot period, shorting the transmitter LC tank at the same time as the receiver LC tank is shorted.

21. The method of claim 19, wherein wirelessly transmitting the power using the transmitter LC tank comprises driving the transmitter LC tank with first and second half-bridges respectively coupled to first and second terminals of the transmitter LC tank, and wherein the method further comprises, during the slot period, shorting the transmitter LC tank by turning on a first transistor of the first half-bridge and a second transistor of the second half-bridge.

22. The method of claim 19, wherein the measuring the transmitter signal comprises measuring a first current flowing through the transmitter LC tank.

23. The method of claim 19, wherein the measuring the transmitter signal comprises measuring a first voltage across a capacitor of the transmitter LC tank.

24. The method of claim 19, further comprising determining a transmitter resonant frequency of the transmitter LC tank from the measured transmitter signal, wherein the determining the power loss comprises determining the power loss based on the transmitter resonant frequency.

25. The method of claim 19, wherein the detecting the metallic object comprises detecting the metallic object when the determined power loss is higher than a threshold.

26. The method of claim 19, further comprising, during the slot period, waiting for a blanking time before the measuring the transmitter signal.

27. The method of claim 26, wherein a duration of the blanking time lasts for at least two oscillations of the transmitter LC tank.

28. The method of claim 19, further comprising, during the slot period, shorting the transmitter LC tank by closing a switch directly connected across terminals of the transmitter LC tank.

29. The method of claim 19, wherein the slot period is between 100 μs and 200 μs.

30. The method of claim 19, wherein the slot period is lower than 50 μs.

31. A method comprising:
wirelessly transmitting, by a transmitter LC tank, power to a receiver LC tank;
interrupting wirelessly transmitting the power for a slot period;
during the slot period and after the receiver LC tank was shorted, measuring a transmitter signal associated with the transmitter LC tank;
determining a transmitter damping coefficient of the transmitter LC tank from the measured transmitter signal;
determining a power loss based on the transmitter damping coefficient; and
detecting a metallic object based on the determined power loss.

32. The method of claim 31, further comprising, during the slot period, shorting the transmitter LC tank at the same time as the receiver LC tank is shorted.

33. The method of claim 31, wherein the slot period is between 100 μs and 200 μs.

34. The method of claim 31, wherein the slot period is lower than 50 μs.

35. The method of claim 31, wherein a duration of a blanking time lasts for at least two oscillations of the transmitter LC tank.

36. A method comprising:
wirelessly transmitting, by a transmitter LC tank, power to a receiver LC tank;
interrupting wirelessly transmitting the power for a slot period;
during the slot period and after the receiver LC tank was shorted, measuring a transmitter signal associated with the transmitter LC tank;
measuring an active transmitter current flowing through the transmitter LC tank before interrupting wirelessly transmitting the power;
determining a power loss associated with wirelessly transmitting the power based on the measured transmitter signal and the active transmitter current; and
detecting a metallic object based on the determined power loss.

37. The method of claim 36, further comprising determining a transmitter resistance based on the measured transmitter signal, wherein the determining the power loss is based on the active transmitter current times a difference between the determined transmitter resistance and a nominal transmitter resistance.

38. The method of claim 36, further comprising, during the slot period, shorting the transmitter LC tank at the same time as the receiver LC tank is shorted.

39. The method of claim 36, wherein the slot period is between 100 μs and 200 μs.

40. The method of claim 36, wherein the slot period is lower than 50 μs.

41. The method of claim 36, wherein a duration of a blanking time lasts for at least two oscillations of the transmitter LC tank.

42. A method comprising:
wirelessly transmitting, by a transmitter LC tank, power to a receiver LC tank;
interrupting wirelessly transmitting the power for a slot period;
during the slot period and after the receiver LC tank was shorted, measuring a transmitter signal associated with the transmitter LC tank, wherein the measuring the transmitter signal comprises sampling the transmitter signal at a sampling frequency of at least 100 times a driving frequency of the transmitter LC tank, and wherein a voltage across a switch coupled across the transmitter LC tank is sampled at the sampling frequency;

determining a power loss associated with wirelessly transmitting the power based on the measured transmitter signal and the sampled voltage; and detecting a metallic object based on the determined power loss.

43. The method of claim 42, further comprising, during the slot period, shorting the transmitter LC tank at the same time as the receiver LC tank is shorted.

44. The method of claim 42, wherein the slot period is between 100 μs and 200 μs.

45. The method of claim 42, wherein the slot period is lower than 50 μs.

46. The method of claim 42, wherein a duration of a blanking time lasts for at least two oscillations of the transmitter LC tank.

* * * * *